United States Patent [19]
Karabed et al.

[11] Patent Number: 5,537,424
[45] Date of Patent: Jul. 16, 1996

[54] MATCHED SPECTRAL NULL CODES WITH PARTITIONED SYSTOLIC TRELLIS STRUCTURES

[75] Inventors: Razmik Karabed, San Jose, Calif.; James W. Rae, Rochester, Minn.; Paul H. Siegel; Hemant K. Thapar, both of San Jose, Calif.

[73] Assignee: International Business Machines Corporation, Armonk, N.Y.

[21] Appl. No.: 289,811

[22] Filed: Aug. 12, 1994

[51] Int. Cl.⁶ .................................................. H03M 13/12
[52] U.S. Cl. .................................................. 371/43
[58] Field of Search .................................................. 371/43

[56] References Cited

U.S. PATENT DOCUMENTS

| | | | |
|---|---|---|---|
| 4,620,311 | 10/1986 | Schouhamer Immink | 375/19 |
| 4,888,779 | 12/1989 | Karabed et al. | 371/43 |
| 5,257,272 | 10/1993 | Fredrickson | 371/43 |
| 5,280,489 | 1/1994 | Fredrickson et al. | 371/45 |
| 5,327,440 | 7/1994 | Fredrickson et al. | 371/43 |

OTHER PUBLICATIONS

Commonly assigned U.S. application Ser. No. 08/174,904, filed Dec. 24, 1993.
Commonly assigned U.S. application Ser. No. 08/242,942, filed May 15, 1994.

*Primary Examiner*—Stephen M. Baker
*Attorney, Agent, or Firm*—Henry E. Otto, Jr.

[57] ABSTRACT

Apparatus and method for transmitting spectral null sequences of a spectrally-constrained code over a partial response channel. A Viterbi detector receives the sequences from the channel and has a time-varying detector trellis structure derived from a running-digital-sum (RDS) trellis structure that requires each one of a set of quasicatastrophic sequences to be generated only from a trellis state corresponding to a respective preselected unique RDS value.

21 Claims, 13 Drawing Sheets

MATCHED SPECTRAL NULL CODES WITH PARTITIONED SYSTOLIC TRELLIS STRUCTURES

FIELD OF THE INVENTION

This invention relates to coding and maximum-likelihood detection of input strings of binary data applied to partial-response channels. More particularly, it relates to methods and apparatus wherein a maximum-likelihood detector employs a periodic partitioned systolic trellis structure with time-varying replication of states and edges, preferably implemented with vertical compression of portions of the trellis structure to constrain spectral-null sequences generated from an initial running-digital-sum (RDS) value to assume a certain prescribed subset of RDS values at both the end and at least one prespecified interior position within the trellis period, for providing improved coding gain, constraints for timing and gain control, and reduced error-event lengths.

BACKGROUND OF THE INVENTION

The following prior art references are considered by applicants to be the most pertinent to the present invention:

[A] U.S. Pat. No. 4,888,779, granted Dec. 19, 1989, entitled "Matched Spectral Null Trellis Codes For Partial Response Channels."

[B] U.S. Pat. No. 5,257,272, granted Oct. 26, 1993, entitled "Time-Varying Modulo N Trellis Codes For Input Restricted Partial Response Channels."

[C] U.S. Pat. No. 5,280,489, granted Jan. 18, 1994, entitled "Time-Varying Viterbi Detector For Control Of Error Event Length."

[D] U.S. Pat. No. 5,327,440, granted Jul. 05, 1994, entitled "Systolic Architecture For Viterbi Detection Of DC-Free Sequences."

[E] Commonly assigned U.S. application Ser. No. 08/174,904, (Docket SA9-93-023), filed Dec. 24, 1993, entitled "Permuted Trellis Codes For Input Restricted Partial Response Channels."

[F] Commonly assigned U.S. application Ser. No. 08/242,942, (Docket SA9-94-012), filed May 16, 1994, entitled "Trellis Codes With Algebraic Constraints For Input Restricted Partial Response Channels."

Partial response channels of interest for data storage devices include those with channel polynomials of the form $P(D)=(1-D^n)$ or $(1+D^n)$, where n is a nonnegative integer. Channels with this form have a practical implementation advantage in that they can be de-interleaved into n separate (1−D) channels or n separate (1+D) channels, respectively. In Reference [A], coding and detection are accomplished by n-way interleaving of appropriate codes for the dicode channel, with polynomial (1−D), or n-way interleaving of appropriate codes for the so-called class-I partial-response channel, with polynomial (1+D).

Reference [A] discloses a method for increasing the reliability of partial response storage channels by increasing the minimum distance between coded output sequences using codes designed to match the spectral nulls in a channel partial response polynomial. The Viterbi detectors in Reference [A] reduce complexity by tracking only the spectral content of detected sequences.

The "minimum distance" of a particular detector trellis (sometimes referred to in the art as $d^2_{free}$) is defined as the minimum sum of the squared differences between sequences of noiseless sample values resulting from two distinct paths that diverge from a common state on the trellis and remerge to a common state. For partial response, maximum likelihood (PRML) detection, the minimum distance is 2; but the first-order matched-spectral null codes of Reference [A] increase the minimum distance to 4. In order to realize the benefits of increased minimum distance in a Viterbi detector with finite path memory, it is required that any pair of sequences consisting of a coded sequence and another detector trellis sequence accumulate the distance within a finite number of samples. If the code contains "quasi-catastrophic" sequences, which are defined as sequences that are represented by more than one distinct path through the detector trellis, the minimum distance will not be accumulated in a finite number of samples, so it is necessary for the code to avoid such sequences. Reference [A] describes a method for eliminating quasicatastrophic sequences. However, in practice, reducing the required path memory to an appropriate length forces the encoder/decoder to become unacceptably complex.

Reference [B] describes a Viterbi detector which replicates a conventional trellis pattern for the desired channel N times. The N copies of the channel response trellis are interconnected in such a way that a preselected function associates each state in the trellis with a particular integer value modulo N. The number N is selected according to the channel detection and coding constraints so that diverging erroneous sequences of minimum distance lead to detector states which are distinct from the correct detector state. Only certain values of the preselected function tracked modulo N are allowed every m bits in order to increase the minimum distance between output sequences in the partial response channel and eliminate quasicatastrophic sequences. The codes described in Reference [B] do not match the spectral nulls in the polynomial for the channel.

Reference [C] describes a Viterbi detector based upon a time-varying trellis structure for detection of codes with spectral nulls or spectral-density nulls. The time-varying structure provides for reduced error-event length by eliminating paths corresponding to certain quasi-catastrophic sequences. The trellis is obtained by selective deletion of states and edges from the trellis that tracks the spectral content of the output sequences. However, while this selective deletion eliminates duplicate paths generating quasi-catastrophic sequences, it also eliminates many paths generating sequences that might have been acceptable codewords and thereby reduces the achievable rate of codes supported by the modified trellis. Therefore, in order to maintain the desired high code rates, it was necessary to significantly increase the codeword block length or the number of trellis states, resulting in larger code and detector complexity.

Reference [D] describes sequences that are concatenated according to rules that depend upon the running digital sum (RDS) value of a sequence and that of its successor. The detector trellis structure combines subtrellises that track RDS or RDS modulo N, with reassignment of survivor metrics and survivor sequences at the subtrellis boundaries according to the sequence concatenation rules. The resulting detector trellis structure requires periodic permutation of states and hence is referred to as a "permuted" trellis code. The sequences and the concatenation rules are selected to realize coding gain, eliminate quasi-catastrophic sequences from the detector trellis, limit the complexity of the maximum-likelihood detector, and improve runlength constraints relative to earlier proposed methods.

Reference [E] describes sequences that satisfy an algebraic constraint on a predetermined algebraic attribute which identifies output sequences that differ from each other by a preselected error event. The detector tracks the algebraic attribute by iteratively computing from the symbols sequentially output from the detector trellis the value of the algebraic attribute at the end of each codeword. Violations of the algebraic constraint are flagged to detect the occurrence of the preselected error event. Allowable channel input sequences are constrained so that they will assume only a single value periodically in time. The detector trellis is made time-varying by removing from the trellis all output sequences that fail to satisfy the preselected algebraic constraint, thereby correcting said error event. The trellis is constructed to incorporate the current state of the partial response channel memory, the current state of the algebraic attribute, and, in an inner-coded system, the state of the inner code.

Reference [F] describes a systolic Viterbi detector trellis structure for MSN-coded and uncoded PRML channels. The architecture eliminates redundant detector calculations and incorporates modified butterfly trellis geometries and rotates state-metric assignments by one for simplifying the detector apparatus.

None of these references suggests (1) providing an encoder for a spectral-null code that partitions the set of sequences that are quasicatastrophic in a running-digital-sum (RDS) time-varying trellis structure by constraining codewords generated from an initial RDS value to assume prescribed subsets of allowable RDS values at both the codeword end and at least one prespecified interior location in the codeword; (2) providing a time-varying detector with a partitioned trellis structure which reflects the constraint on the encoded sequences by replicating certain states and edges in order to effect partitioning of the quasicatastrophic sequences; and (3) providing high rate MSN codes which further reduce the maximum length of error events at minimum distance and next-minimum distance, while retaining the beneficial features of the codes described in the above cited references.

SUMMARY OF THE INVENTION

An apparatus and method are described for improving reliability of a data storage device that transmits binary data as codewords over a partial response channel. A modified encoder constructs from the binary data a spectral-null trellis code that constrains the codewords generated from an initial RDS value to assume prescribed subsets of allowable RDS values at both the codeword boundary and a prespecified interior location of the codeword. This partitions certain sets of sequences with specified RDS values among the initial RDS values.

A modified Viterbi detector generates a most probable binary output sequence from codewords received by the channel. The detector uses a trellis structure that reflects the partitioning constraints imposed by the encoder, replicating specified states and edges in a periodic, time-varying manner. The constraints on the RDS within the codeword guarantees distance accumulation properties that favorably impact the truncation depths of the code; that is, the number of steps in the trellis beyond which any pair of sequences generated by diverging trellis paths accumulate a prescribed distance, such as the minimum or next-minimum distance.

The function of the detector using the partitioned trellis preferably is implemented by combining a "vertically compressed" systolic RDS trellis structure with auxiliary trellis structures for determining the most probably survivor sequences for specific states at the preselected interior location in the RDS trellis structure.

DESCRIPTION OF PREFERRED EMBODIMENTS

Overview

A new class of matched spectral null (MSN) trellis codes, with "partitioned" trellis structures is disclosed. Two rate 8/10 MSN partitioned codes are described that have the smallest truncation depths (for minimum and next-minimum distance) of existing rate 4/5, 8/10, or 16/20 trellis codes for Class-4 partial response. Unlike previously proposed codes, these new codes, as earlier noted, constrain the codewords generated from an initial RDS value to assume prescribed subsets of allowable RDS values at both the codeword boundary and at least one prespecified interior location of the codeword. The added constraint on the RDS within the codeword guarantees distance properties that favorably impact the truncation depths. The choice of the interior position at which the RDS constraint is enforced provides a tradeoff between code constraints and detector trellis complexity. In addition, the added constraint allows use of a simple two-state encoder and a block decoder that eliminates error propagation.

The detectors for the MSN codes here described are based upon a novel, reduced-complexity, time-varying "partitioned" systolic trellis structure which differs significantly from the time-varying trellis structures described in the cited prior art. In essence, the RDS constraints imposed by the code partition the quasicatastrophic sequences (i.e., sequences which can be generated in the canonical trellis from more than one initial RDS state) into disjoint subsets, and assign each subset to an initial RDS state. The partitioned trellis structure reflects this assignment.

Use of auxiliary trellises to determine the survivor sequences for specific internal states in the time-varying detector structure permits portions of the partitioned trellis of a rate 8/10 code to be vertically compressed to form a six-state structure that is contained in the systolic trellis of the rate 8/10 MSN code disclosed in Reference [A]. One of the rate 8/10 codes herein described even admits a six-state modified detector that achieves true maximum-likelihood performance. In contrast, a straightforward implementation of the partitioned detector trellis would almost double the required number of trellis states (and therefore of Add-Compare-Select (ACS) units) relative to the six-state systolic structure of the rate 8/10 MSN code described in Reference [F] and would require some four-input comparators.

Figure 1:
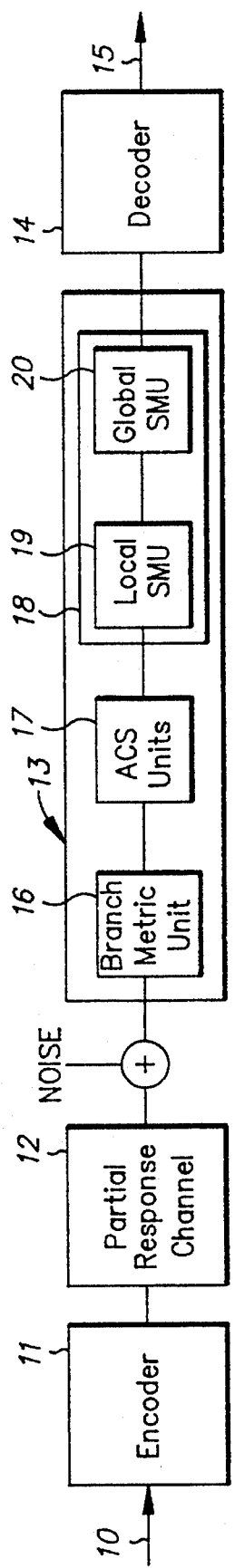
FIG. 1 is a block diagram of a data storage system embodying the invention comprising a modified encoder, a partial response channel, a modified Viterbi detector, and a decoder.

As depicted in FIG. 1, input data, such as in the form of binary symbol strings, is transmitted from a bus 10 to an encoder 11. Encoder 11 comprises means to generate, from a unique initial RDS value, binary codewords constrained to assume prescribed subsets of RDS values at the end of each codeword and also at a prespecified location within each codeword. Each codeword serves as input to a partial response channel 12 with a system polynomial P(D) representing the channel memory. A channel output sequence is generated by partial response channel 12, corrupted by noise, and detected at the channel output by a modified Viterbi detector 13 for implementing the invention. Detector 13 calculates and estimates, from the channel output sequence, the most probable coded sequence. A decoder 14 uses this estimate, as calculated by detector 13, to recover the original input data and output it to a bus 15. Trellis codes and corresponding Viterbi detectors are disclosed for use with partial response channels having characteristic polynomials of the form $P(D)=1\pm D^n$. The encoder 11 and detector 13 are made time-varying, as taught in References [B], [C], [D] and [E].

Detailed Description

According to a feature of the invention, and as indicated in FIG. 1, detector 13 comprises a conventional branch metric circuit 16, add-compare-select (ACS) units 17 with a modified interconnection configuration, and a survivor metric unit (SMU) 18 which includes a local SMU subunit (LSMU) 19 and a global SMU subunit (GSMU) 20 (each hereinafter more fully described). Detector 13 has a partitioned systolic trellis structure that divides into disjoint subsets those sequences that are quasicatastrophic with respect to a conventional or a time-varying RDS trellis structure, as in References [A] or [C], respectively. Detector 13 assigns each subset to a unique initial RDS state that renders said sequences noncatastrophic and thus available for use by the partitioned code.

Figure 2:
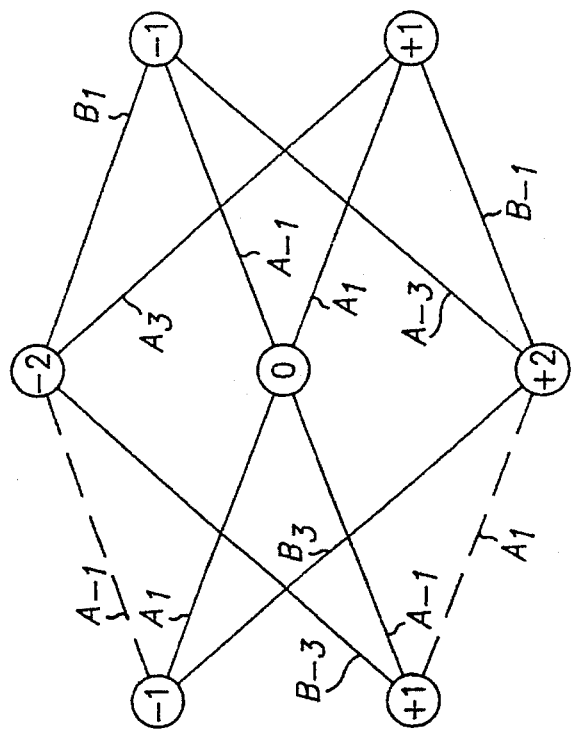
FIG. 2 depicts a configuration of concatenated subsets of length-5 binary sequences with specified running-digital-sum (RDS) values, yielding 275 length-10 sequences outgoing from each of two initial RDS values and representing candidate codewords for a rate 8/10 code.

In the preferred rate 8/10 codes constructed in accordance with the invention, two 5-bit subsequences are concatenated to form each 10-bit codeword. The configuration of concatenated subsets is depicted in FIG. 2. The nodes represent charge states and the edges represent sets of 5-tuples with a given accumulated charge. Binary 0 and 1 are assumed to represent −1 and +1 charges, respectively. Thus, for example, the edge labelled $A_1$ represents the subset of all 5-bit sequences that accumulate a charge of +1 and connect charge state −1 to state 0.

The subsets $A_{\pm 1}$ and $A_{\pm 3}$ are easily determined by enumerating the 32 possible combinations of 5 bits and computing the accumulated charge. These subsets (converted to decimal numbers) are:

$A_1=\{7,11,13,14,19,21,22,25,26,28\}$ $A_{-1}=\{3,5,6,9,10,12,17,18,20,24\}$ $A_3=\{15,23,27,29,30\}$ $A_{-3}=\{1,2,4,8,16\}$

The paths of length 10 from state −1 to −1 and −1 to +1 represent concatenation of subsets of 5-bit sequences. For example, concatenation of 5-bit sequences from subset $A_1$ with those from the subset $A_{-1}$ results in a net accumulated charge of 0. Thus, as shown, the charge states remain unchanged at the beginning and end of the concatenated sequences, and these paths terminate in state −1. Likewise, concatenation of sequences from subset $A_3$ with those from $A_{-1}$ produces sequences that accumulate a charge of +2. These sequences start from state −1 and end in state +1.

These paths of length 10 define the available codewords for state −1, denoted S(−1), which are compactly represented in terms of the subsets $A_{\pm 1}$ and $A_{\pm 3}$ as follows:

| | | |
|---|---|---|
| $A_1$ | $A_{-1}$ | (ending state −1) |
| $A_3$ | $A_{-3}$ | (ending state −1) |
| $A_1$ | $A_1$ | (ending state +1) |
| $A_3$ | $A_{-1}$ | (ending state +1) |

Likewise, the codewords for state +1, denoted S(+1), are:

| | | |
|---|---|---|
| $A_{-1}$ | $A_1$ | (ending state +1) |
| $A_{-3}$ | $A_3$ | (ending state +1) |
| $A_{-1}$ | $A_{-1}$ | (ending state −1) |
| $A_{-3}$ | $A_1$ | (ending state −1) |

According to a feature of the invention, the set S(+1) of codewords emanating from state +1 in FIG. 2 does not contain the sequences of length 10 represented by $A_1 A_{-3}$ or $A_1 A_{-1}$, (indicated by the dash line labeled $A_1$). Similarly, the set S(−1) of codewords emanating from state −1 in FIG. 2 does not contain the sequences of length 10 represented by $A_{-1} A_1$ or $A_{-1} A_3$ (also indicated by a dash line labeled $A_{-1}$). Consequently, set S(+1) does not intersect the set S(−1) of codewords emanating from state −1. Also, the codewords from state +1 are the bit-wise complements of those from state −1. If the data-to-codeword assignment is chosen in such a way that an input data byte b assigned to a codeword c in set S(+1) is also assigned to the complementary codeword c in S(−1), the code will have 180-degree phase invariance.

Based on the number of elements in each subset $A_1, A_{-1}, A_3, A_{-3}$ and the definition of the sets S(+1) and S(−1), it is easily verified that there are 275 candidate codewords for each of the two originating states. A rate 8/10 code requires only 256 codewords. The extra codewords can be eliminated, for example, to satisfy requirements related to the k-constraint or to the minimum number of non-zero samples per codeword.

Table 1, and all other tables, are set forth in an APPENDIX hereto, which is made part hereof. As shown on Table 1, by removing a particular subset of 12 codewords a set of 263 codewords is retained that can be used to define a code with maximum output zero runlength k=4 within codewords and k=5 at the codeword boundaries; i.e., at the beginning and end of the codeword. The code thus defined has at least three non-zero samples per codeword, a feature useful for assuring sufficient frequency of timing and gain updates for decision-directed control loops. Only 36 codewords do not contain a sequence of the form "010" or "101", which forms are particularly beneficial for timing recovery. Of these, 26 are highly likely to generate such a sequence at the codeword boundary. Eliminating seven of the remaining 10 words to produce 256 codewords yields a code that is less susceptible to errors in timing recovery.

Figure 3:
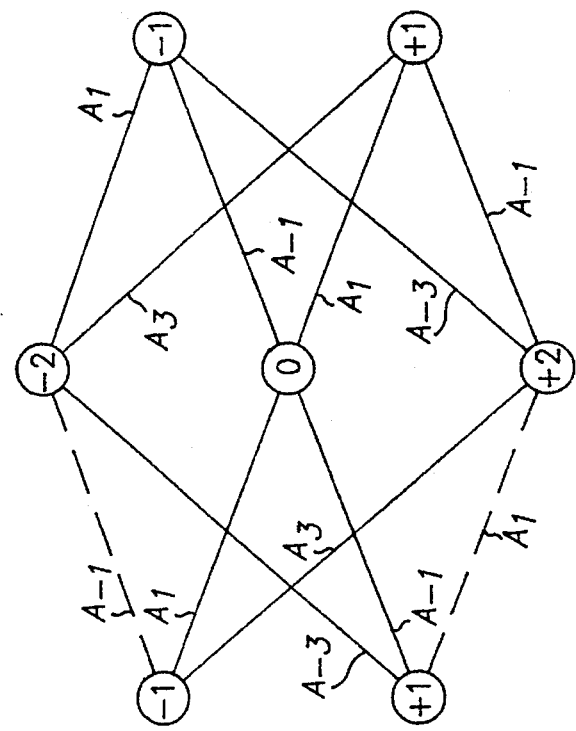
FIG. 3 depicts a modified configuration of concatenated subsets of length-5 binary sequences with specified RDS values, yielding the 256 codewords consisting of length-10 sequences outgoing from each of two initial RDS values for a specific rate 8/10 code.
Figure 4:
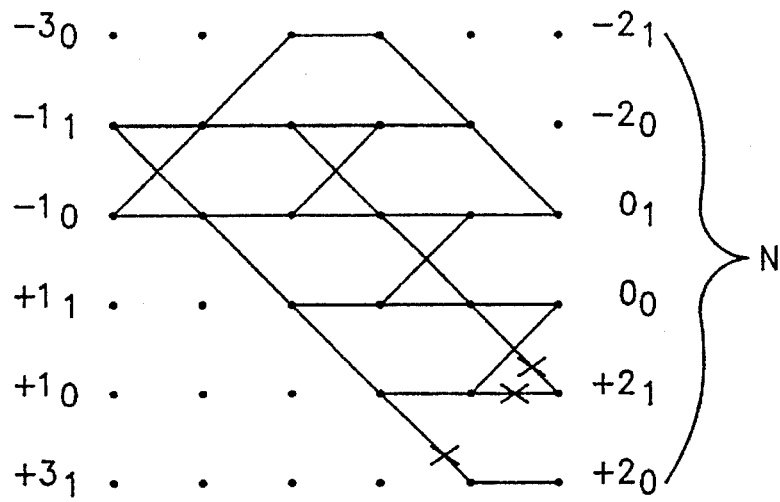
FIG. 4 depicts a partitioned systolic trellis structure corresponding to the concatenation configuration of FIG. 2.
Figure 4:
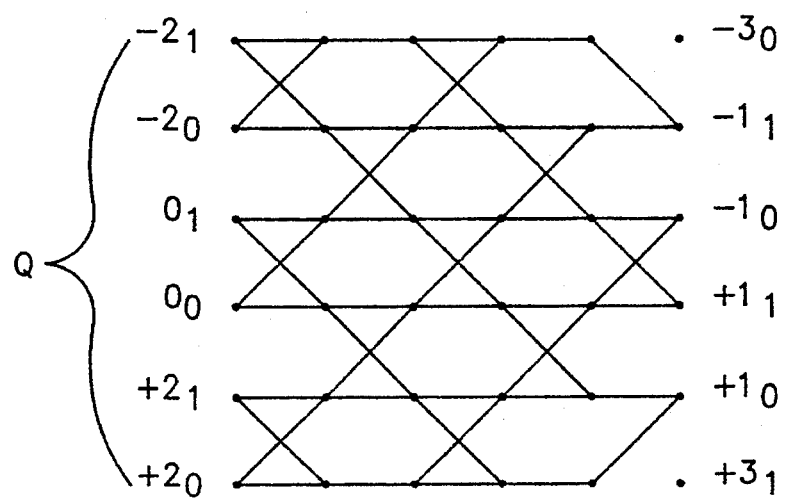
Figure 4:
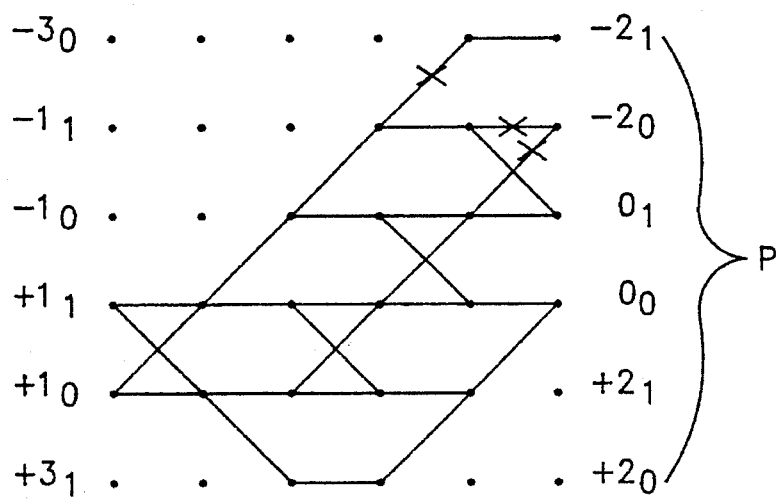

If preferred, a different subset of 256 codewords can be selected from the original 275 to generate a code whose codewords are precisely those generated by the partitioned trellis structure obtained from FIG. 4 by deleting all edges and leaving states $-2_0$ and $+2_1$. This allows maximum-likelihood detection with moderate complexity, but it does not provide flexibility in choosing codewords that will achieve desirable timing recovery constraints. FIG. 3 shows the configuration of concatenated subsets for such a code. The sets $B_{\pm 1}$ and $B_{\pm 3}$ referred to in FIG. 3 are subsets of $A_{\pm 1}$ and $A_{\pm 3}$, respectively, and (converted to decimal numbers) are defined as:

$B_1$={11,13,14,19,21,22,25,26,28}

$B_{-1}$={3,5,6,9,10,12,17,18,20}

$B_3$={15,23,27,29}

$B_{-3}$={2,4,8,16}

Given the number of elements in each set, it is easily shown that there are exactly 256 codewords from each originating state in FIG. 3. The code parameters related to timing/gain recovery constitute to an MSN code with k=5 and at least two non-zero samples per byte.

The codes defined by FIGS. 2 and 3 and constructed in accordance with the invention provide reduced truncation depths, improved block decoder structure, and superior error-rate performance. "Truncation depth", as earlier defined, is the length beyond which any code output sequence achieves the specified distance from any other sequence supported by the trellis structure. The truncation depth for minimum distance 4 and next-minimum distance 6 is reduced by more than 50% and near-maximum-likelihood performance (or true maximum-likelihood performance, in the configuration depicted in FIG. 3) is achieved with the modified Viterbi detector 13, hereinafter to be described.

Partitioned Trellis Structure

In the following description of an RDS systolic trellis structure, such as described in Reference [F], the trellis states are designated as $V_m$, where V is an RDS value and m denotes the (1−D) dicode channel memory. The V will be an odd integer value at even times or stages of the trellis and an even integer value at odd times or stages of the trellis.

To avoid quasicatastrophic sequences in the codes herein described, the RDS systolic detector structure taught by the prior art is modified to create a time-varying partitioned trellis structure of period 10 that not only supports all of the coded channel output sequences, but also generates each with a unique trellis path. The code will then have no sequences that are quasicatastrophic with respect to the modified trellis structure. As a result, the maximum length $\eta(4)$ of minimum distance 4 error events and the maximum length $\eta(6)$ of next-minimum distance 6 error events desirably are reduced to:

$\eta(4) \leq 20$ code bits $\eta(6) \leq 30$ code bits

Moreover, the corresponding truncation depths, $\tau(4)$ and $\tau(6)$ satisfy the same bounds:

$\tau(4) \leq 20$ code bits $\tau(6) \leq 30$ code bits

These bounds are significantly less than those of the trellis codes disclosed in the cited references. These reduced bounds result from the use of the code concatenation configuration disclosed in FIG. 2 or FIG. 3 with the partitioned trellis structure of FIG. 4 or preferably the vertically compressed partitioned trellis structure of FIGS. 5 and 6.

For sake of illustration, the following description will explain how the invention is implemented with the rate 8/10 code configuration depicted in FIGS. 2 and 4.

The modified detector trellis structure, depicted in FIG. 4, reflects the inherent partitioning of the RDS charge states at the middle of the codeword, as well as the RDS constraints at the codeword boundaries. As a result of the partitioning, codewords from state −1 pass through only charge states 0 and +2 after five bits, and codewords from state +1 pass through only charge states 0 and −2 after five bits.

As shown in FIG. 4, each beginning and ending state shown in FIG. 2 is split into two states to reflect the channel memory of the dicode channel. Thus, the three possible states in the middle of the codeword become six states.

If the Viterbi algorithm is applied to the partitioned trellis structure depicted in FIG. 4, there are two potential drawbacks from the standpoint of circuit complexity and throughput rate. First, at certain instants, as many as 10 add-compare-select (ACS) units may be needed to operate in parallel. Second, at certain states at time 5 (modulo 10), a four-way comparison will be required, rather than the conventional two-way comparison.

More specifically, the partitioned trellis structure can best be visualized as a "Y" turned 90° counterclockwise and having angled trellis portions N and P that join the same trellis portion Q. Referring to FIG. 4, at time 5, the trellis states $0_1$, $0_0$, $+2_1$, and $+2_0$ of portion N are commoned with these same trellis states in the portion Q; and at time 5, the trellis states $-2_1$, $-2_0$, $0_1$, and $0_0$ of portion P are commoned with these same trellis states in portion Q.

In the partitioned trellis structure, the survivor sequence at state $-2_1$, at time 5 is now forced to come from a code string in the set $A_{-3}$, along a path originating from state $1_1$ or $1_0$. The only 5-bit code sequence satisfying this condition is 00001, and the two corresponding trellis paths comprise the path from state $1_1$ with outputs $-10001$, and the path from state $1_0$ with outputs 00001.

In the partitioned trellis structure, the survivor sequence at state $-2_0$ at time 5 is also now forced to come from a 5-bit code sequence in the set $A_{-3}$ along a path originating from state $1_1$ or $1_0$. There are only four such code strings:

```
0 0 0 1 0
0 0 1 0 0
0 1 0 0 0
1 0 0 0 0
``` with corresponding trellis sequences:

| | | | | |
|---|---|---|---|---|
| {0, −1} | 0 | 0 | 1 | −1 |
| {0, −1} | 0 | 1 | −1 | 0 |
| {0, −1} | 1 | −1 | 0 | 0 |
| {1, 0} | −1 | 0 | 0 | 0 | where, for convenience, the two output samples in the braces correspond to the labels on the first edge of the paths from state $1_1$ and $1_0$, respectively.

In a complementary manner, the survivor sequence at state $2_0$ at time 5 must come from the code bit sequence 1 1 1 1 0, corresponding to the paths from states $-1_1$ and $-1_0$ that generate output samples 0 0 0 0 −1 and 1 0 0 0 −1, respectively.

Similarly, the partitioned trellis forces the survivor sequence at state $2_1$ at time 5 to come from a 5-bit code sequence in the set $A_3$ along a path originating from state $-1_1$ or $-1_0$. There are again only four such code strings:

```
1 1 1 0 1
1 1 0 1 1
1 0 1 1 1
0 1 1 1 1
``` with corresponding trellis sequences:

| | | | | |
|---|---|---|---|---|
| {0, 1} | 0 | 0 | −1 | 1 |
| {0, 1} | 0 | −1 | 1 | 0 |
| {0, 1} | −1 | 1 | 0 | 0 |
| {−1, 0} | 1 | 0 | 0 | 0 | where the two output samples in the braces correspond to the labels on the first edge of the path from states $-1_1$ and $-1_0$, respectively.

Vertically Compressed Architecture and Auxiliary Survivor Computation

Figure 5:
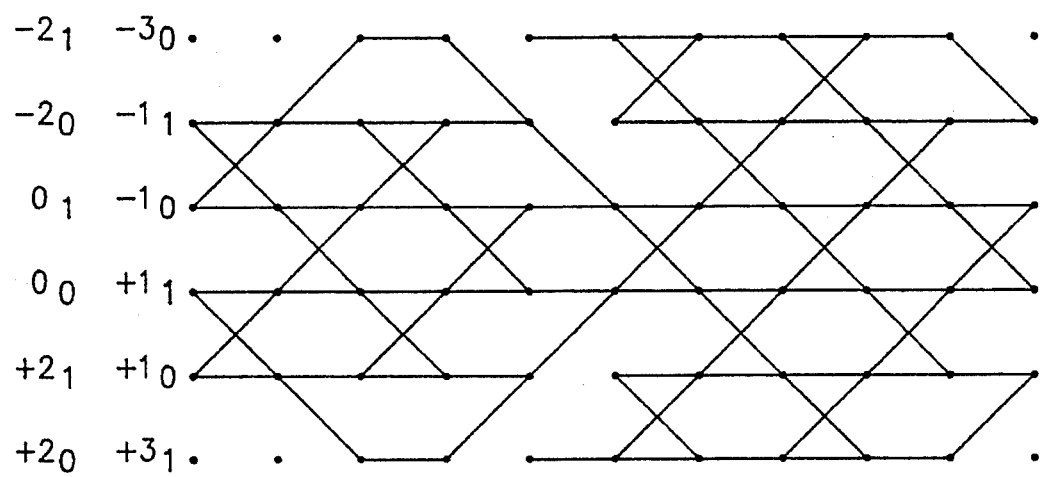
FIG. 5 depicts a "vertically compressed" systolic RDS trellis structure that is used in conjunction with auxiliary trellis structures to implement the modified architecture for the partitioned trellis structure of FIG. 4.
Figures 6, 7:
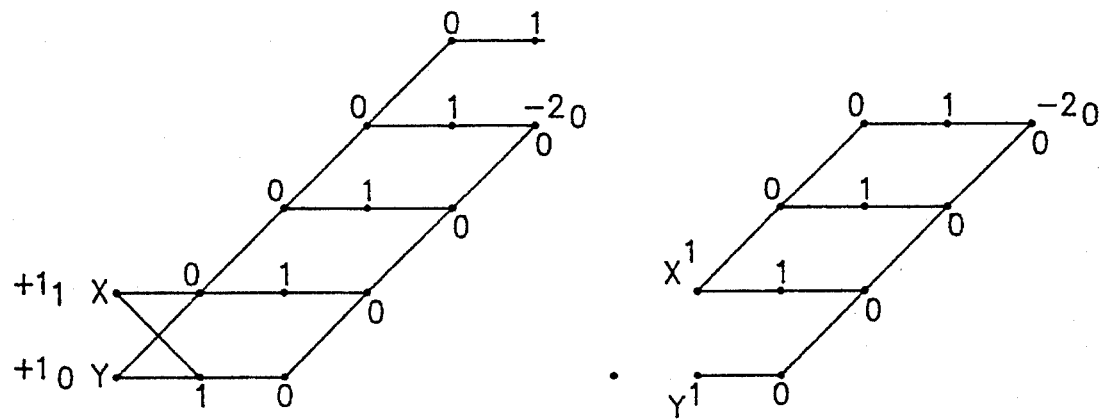
FIG. 6 depicts one of the auxiliary trellis structures used in the modified architecture to compute survivor paths and metrics for states $2_1$ and $-2_0$ at time 5 modulo 10 in the trellis structure of FIG. 5.
FIG. 7 depicts the final four stages of the auxiliary trellis structure of FIG. 6.

According to the invention, these drawbacks are resolved by performing a recursive auxiliary calculation during times 1 to 5 (modulo 10) using the auxiliary trellis depicted in FIG. 6 in combination with a state-metric transfer at time 5 (modulo 10) to a "vertically compressed" or "flattened" portion of the partitioned trellis structure, as depicted in FIG. 5, for simplifying implementation of the algorithm by the Viterbi detector 13. More specifically, the portions N and P in FIG. 4, while still commoned to portion Q, are vertically compressed, after deleting the edges in FIG. 4 designated with an X, to provide the resultant trellis structure depicted in FIG. 5. The auxiliary trellis shown in FIG. 6 and its complement reflect the paths and sequences of FIG. 4 that are eliminated by deletion of the edges X that were part of the partitioned structure prior to its vertical compression.

In the vertically compressed six-state trellis structure, the conventional Viterbi algorithm is applied to determine the survivor sequences and metrics at all states and all times, except the survivor sequences and metrics for the states $-3_0$ and $3_1$ at time 4, and for states $-2_1$ and $2_0$ at time 5.

At time 4 (modulo 10), the survivor sequence for state $-3_0$ is the concatenation of the survivor sequence for state $0_0$ at time 1 with the sequence 0 0 0 appended. The survivor metric is set to the survivor metric for state $0_0$ at time 1. Note that the intermediate branch metrics are all zero in the systolic trellis structure.

The computation of the survivor sequence and metric for state $-2_0$ at time 5 is determined from the auxiliary trellis shown in FIG. 6. In FIG. 6 the survivor metrics at time 0 for states $1_1$ and $1_0$ are denoted by X and Y, respectively. The survivor extensions for time 1 are computed, in the manner described in Reference [A], using ACS units available in the vertically compressed trellis structure shown in FIG. 5. The remaining computation is governed by the final four stages of the auxiliary trellis structure, which are shown in FIG. 7. In FIG. 7, the survivor metrics for states $0_0$ and $2_1$ at time 1 are denoted by X' and Y', respectively. The resulting survivor metric at time 5 is described by the expression:

$$Z = min\{Y'+b_2^-,\ X'+b_2^++b_3^-,\ X'+b_3^++b_4^-,\ X'+b_4^++b_5^-\},$$

where the symbols $b_i^+$ and $b_i^-$ denote the branch metrics at time i corresponding to an edge labelled with a symbol +1 or a symbol −1, respectively. This can be written as:

$$Z = min\{Y'',\ X'+min\{b_2^++b_3^-,\ b_3^++b_4^-,\ b_4^++b_5^-\}\}$$

where $$Y'' = Y' + b_2^-.$$

Using the following scaled definitions of the conventional "linearized" branch metrics:

$$b_i^+ = -y_i + \tfrac{1}{2}$$

and $$b_i^- = y_i + \tfrac{1}{2},$$

where $y_i$ denotes the received sample at time i, the metric calculation can be written as:

$$Z = \min\{Y'', X'+\min\{-y_2+y_3+1, -y_3+y_4+1, -y_4+y_5+1\}\}.$$

The implementation of this minimization is simplified by rewriting it in the form:

$$Z = \min\{Y'', X'+1+\min\{y_3-y_2, y_4-y_3, y_5-y_4\}\}.$$

Note that the following features contribute to a simplified architecture for the calculation:

1. Y" is available directly from a register (not shown) whose contents are provided by the vertically compressed partitioned trellis structure of FIG. 5.
2. X'+1 is a fixed increment on X', and can be hardwired, avoiding the need for an additional adder. If preferred, the X' term could be used independently, and the increment by 1 could be incorporated into the minimization $$\min\{y_3-y_2, y_4-y_3, y_5-y_4\}$$

3. This internal minimization can be performed recursively using a 6-bit adder and a 7-bit compare-select (CS) circuit.
4. The final minimization can be performed with an available ACS unit, in a fashion similar to the one used at time 1. Note that four ACS units from the six-state trellis are available at time 5.

The survivor computations for the complementary states, $3_1$ at time 4 and $2_1$ at time 5, are complementary to the preceding computations. In particular, the minimization for state $2_1$ at time 5 can be expressed in the form:

$$T = \min\{S'', R'+1-\max\{y_3-y_2, y_4-y_3, y_5-y_4\}\},$$

where the quantities T, S", and R' are the obvious counterparts of Z, Y", and X', discussed in connection with FIG. 7.

The auxiliary trellis computations for the complementary pairs of states can be executed as follows:

a) Determine min, max $\{y_3-y_2, y_4-y_3, y_5-y_4\}$ recursively.
b) Store the quantities (X'+1), Y", (R'+1,), S" in registers. (The added terms 1 and −1 can be lumped into step a if desired.)
c) Perform the final minimization at time 5 using ACS units available from the six-state trellis of FIG. 5.

Encoder and Decoder Logic

Boolean logic implements the encoding and decoding functions for the rate 8/10 partitioned MSN codes. The concatenated structure underlying the code sequences shown in FIG. 2 is exploited to derive a "two-dimensional" data-to-codeword assignment that allows a simple encoder and decoder implementation.

Code sequences are denoted by w=uv, where u=$u_1, \ldots, u_5$ and v=$v_1, \ldots, v_5$ are the first and last 5-bit subsequences of w.

FIG. 2 constrains the allowable code sequences in such a way that u and v must come from prescribed combinations of the subsets $A_{\pm 1}$ and $A_{\pm 3}$. These subsets contain the sequences with accumulated charge indicated by the subscript. There is another, equivalent characterization of the sequences in each of the subsets; namely, in terms of their Hamming weight (i.e., the number of 1's in the sequence). Specifically, the sequences in subset $A_k$ are precisely those 5-tuples with Hamming weight j, where $$j = \frac{5+k}{2}$$

The notations $U_j$ and $V_j$ denote the 5-tuples of weight j from which u and v are drawn.

Data sequences are denoted by z=xy, where x=$x_1, \ldots, x_4$ and y=$y_1, \ldots, y_4$ are the first and last 4-bit sequences of z. The notations $X_j$ and $Y_j$ denote the 4-tuples of weight j from which x and y are drawn. Note that the number of elements in each of the sets $X_j$ and $Y_j$ is precisely ( ).

Figure 8:
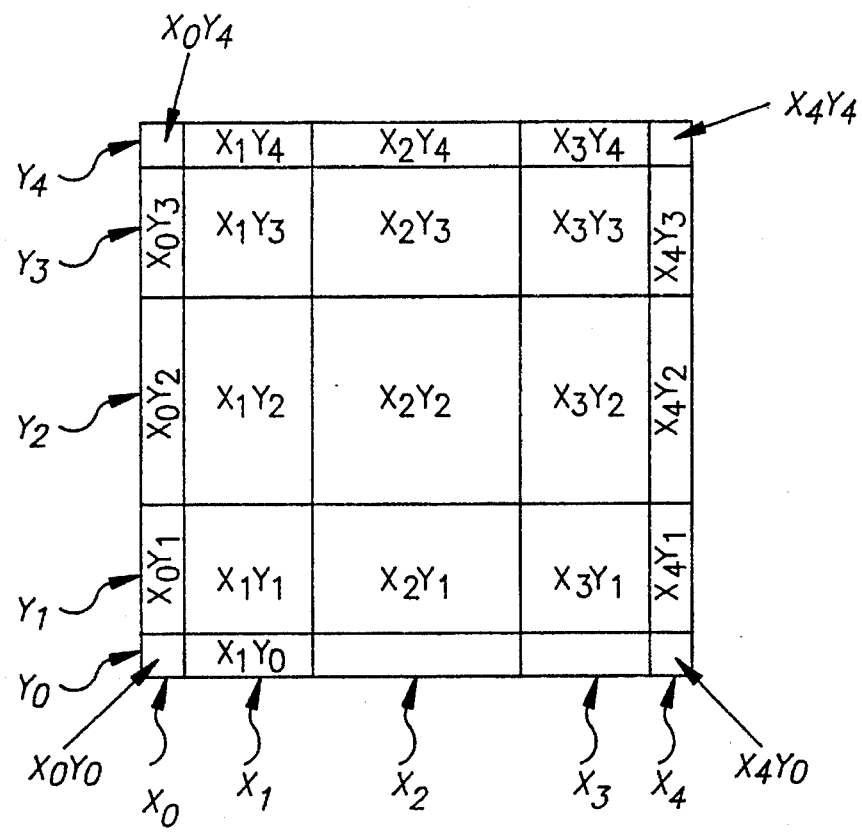
FIG. 8 is a two-dimensional depiction of the 256 data bytes x,y with first four coordinates x broken into subsets $X_j, j=0,1, \ldots, 4$ of Hamming weights $j=0,1, \ldots, 4$ and second four coordinates y broken into subsets $Y_j, j=0,1, \ldots, 4$ of Hamming weights $j=0,1, \ldots, 4$.

FIG. 8 is a two-dimensional depiction of the 256 data bytes x,y, with the coordinate x broken into the sets $X_j$, j=0, 1, ..., 4 and the coordinate y broken into the sets $Y_j$, j=0, 1, ..., 4. The set of data bytes can be decomposed into subsets of the form $X_i Y_j$, corresponding to the rectangular regions shown in FIG. 8.

The data-to-codeword assignment for state −1 makes use of the two-dimensional decomposition based upon Hamming weight. For 97% of the data bytes, the encoder mapping is defined by a pair of simple mappings, each defining one of the individual coordinates u and v in terms of one of the coordinates x or v.

Figure 9:
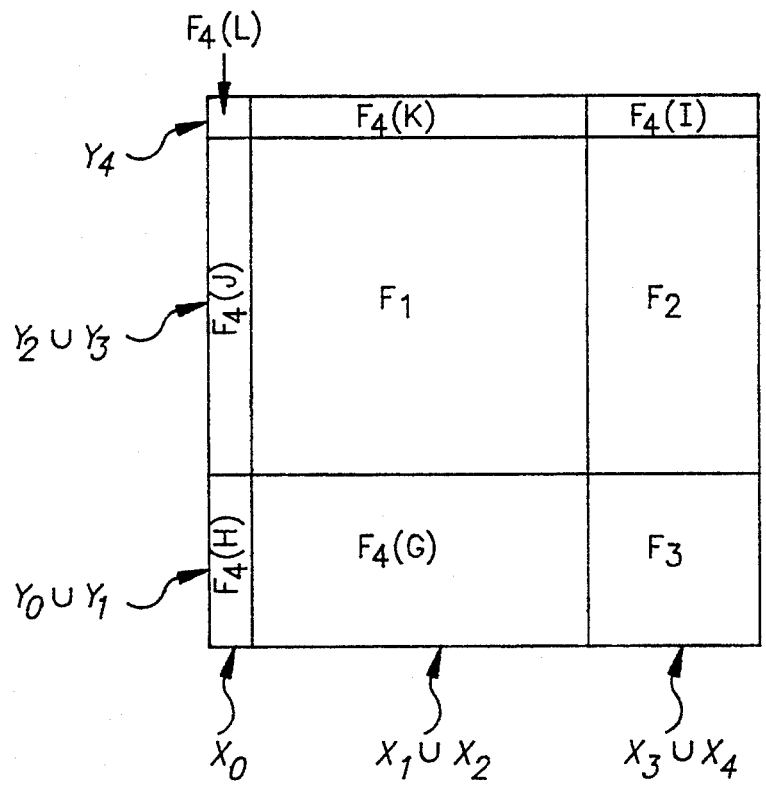
FIG. 9 shows a grid of data bytes subdivided into regions $F_1, F_2, F_3, F_4$.

FIG. 9 shows a grid of data bytes subdivided into regions $F_1, F_2, F_3, F_4$. The four regions are first mapped into the four groups of allowable code sequences described by $A_1A_{-1}$; $A_3A_{-1}$; $A_3A_{-3}$; $A_1A_1$; or, in terms of Hamming weight sets, $U_3V_2$; $U_4V_2$; $U_4V_1$; $U_3V_3$. These mappings are simple in structure, as will now be shown.

Regions $F_1, F_2, F_3$ are defined by $$F_1 = (X_1 \cup X_2) \times (Y_2 \cup Y_3)$$

$$F_2 = (X_3 \cup X_4) \times (Y_2 \cup Y_3)$$

$$F_3 = (X_3 \cup X_4) \times (Y_0 \cup Y_1)$$

The mapping of these regions is determined by four coordinate maps, denoted $\alpha, \beta, \gamma, \delta$, defined as follows:

$\alpha: (X_1 \cup X_2) \to U_3,$ where $$\alpha(x) = \begin{cases} 0, x \text{ if } x & X_1 \\ 1, x \text{ if } x & X_2 \end{cases}$$

and $\beta: (X_3 \cup X_4) \to U_4,$ where $$\beta(x) = \begin{cases} x, 1 \text{ if } x & X_3 \\ x, 0 \text{ if } x & X_4 \end{cases}$$

and $\gamma: (Y_2 \cup Y_3) \to V_2,$ where $$\gamma(y) = \begin{cases} 0, y \text{ if } y & Y_2 \\ 1, x \text{ if } y & Y_3 \end{cases}$$

and, finally, $\delta: (Y_0 \cup Y_1) \to V_1,$ where $$\delta(y) = \begin{cases} y, 1 \text{ if } y & Y_0 \\ y, 0 \text{ if } y & Y_1 \end{cases}$$

Figure 10:
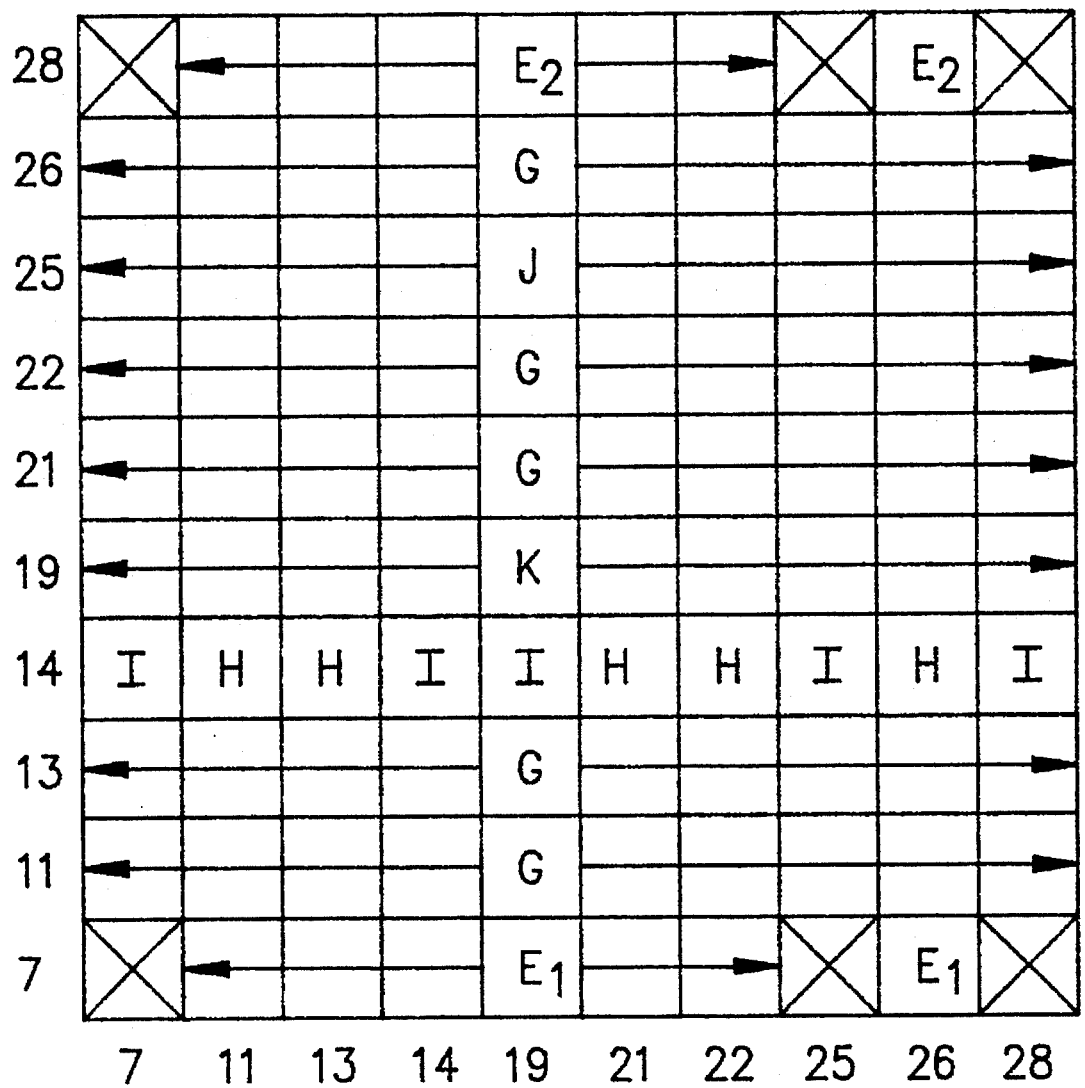
FIG. 10 is a depiction of the mapping of data byte regions G,H,I,J,K onto 80 allowable sequences in the set $A_1 A_1$.

Referring now to FIGS. 9 and 10, mapping of region $F_4$ is somewhat more complicated, and is defined on the following subregions:

$G = (X_1 \cup X_2) \times (Y_0 \cup Y_1)$ $H = X_0 \times (Y_0 \cup Y_1)$ $I = (X_3 \cup X_4) \times Y_4$ $J = X_0 \times (Y_2 \cup Y_3)$ $K = (X_1 \cup X_2) \times Y_4$ $L = X_0 \times Y_4$ The map on subregion G is determined by the map $\alpha$ above, as well as the map $\mu_1: (Y_0 \cup Y_1) \to V_3,$ in which $\mu_1: \{0, 1, 2, 4, 8\} = \{21, 11, 22, 13, 26\}$ where data 4-tuples and code 5-tuples are represented in decimal.

The map on subregion H is determined by the map $\mu_1$ above and the rule:

$(0, y) \to (\mu_1(y), 14).$

Similarly, the map on subregion I is determined by the map $\mu_2: (X_3 \cup X_4) \to U_3,$ where $\mu_2: \{7, 14, 13, 11, 15\} = \{28, 25, 19, 7, 14\},$ and the rule:

$(x, 15) \to (\mu_2(x), 14),$ where 4-tuples and code 5-tuples are again represented in decimal.

The map on subregion J is determined by the map $\mu_3: (Y_2 \cup Y_3) \to U_3,$ where $\mu_3(y) = \begin{cases} 1, & y \text{ if } y \in Y_2 \\ 0, & y \text{ if } y \in Y_3 \end{cases}$ and the rule:

$(0, y) \to (\mu_3(y), 25).$

Finally, the map on subregion K is determined by the map $\alpha$ above and the rule:

$(x, 15) \to (\alpha(x), 19).$

The functions defined above map the 255 data bytes (256 minus the data byte in subregion L) into a subset of the 275 possible sequences in FIG. 2, including all 175 of the sequences in $A_1 A_{-1}$, $A_3 A_{-1}$, $A_3 A_{-3}$, and 80 of the 100 sequences in $A_1 A_1$. As noted above, 12 codewords in the former three sets must be excluded in order to achieve the desired runlength and non-zero-sample constraints and to simplify the detector trellis structure, leaving 263 candidate codewords. These 12 excluded codewords, along with the data bytes mapped to them, as earlier stated, are set forth in Table 1.

To define the code for this implementation, seven more codewords must be eliminated. The sequences thus eliminated and the data bytes that map to them are set forth in Table 2.

There are a total of 13 "exceptional" data bytes that must be remapped to avoid generation of code sequences that have been eliminated from $A_1 A_{-1}$, $A_3 A_{-1}$, and $A_3 A_{-3}$. Note that the mapping defined above on regions G, H, I, J, K does not generate any of the eliminated sequences in $A_1 A_1$. They "hit" the 80 allowable sequences in $A_1 A_1$, where, as shown in FIG. 10, the set $A_1 A_1$ is depicted by a two-dimensional grid.

The 13 exceptional data bytes, and the byte (0,15) comprising region L, are then mapped to the remaining 14 valid code sequences in the top and bottom rows of the grid. The mapping is simplified by breaking the set of 14 data bytes into two subsets denoted $E_1$ and $E_2$, where:

$E_1 = \{(7,7); (8, 7); (11, 7); (12, 7); (13, 7); (14, 7); (15, 7)\}$ and $E_2 = \{(0, 15); (7, 8); (8, 3); (12, 3); (15, 0); (15, 3); (15, 12)\}.$ The bytes in $E_1$ are mapped to the valid code sequences with v=7, and the bytes in $E_2$ are mapped to the valid code sequences with v=28.

The logic implementing these mappings is set forth in Table 3. The logic for the next state function t when the encoder is in state −1 is:

$t = E + \overline{(X_1 + X_2) \cdot (Y_2 + Y_3) + (X_3 + X_4) \cdot (Y_0 + Y_1)}.$ When the encoder is in state +1, the data-to-codeword mapping and the next state function are obtained by bit-wise complementing the corresponding functions defined above for state −1.

Table 4 sets forth the decoder logic. This is simpler than the encoder logic, because the decoder mapping is determined only on 10-bit words that are in the image of the encoder. This provides flexibility in the logic design.

Both the encoder logic and decoder logic make use of Hamming weight indicator functions, which, for simplification, are represented by the same symbols as the subsets with fixed Hamming Weights used in the two-dimensional descriptions of codewords and data bytes. These functions can be implemented in several possible ways. For example, consider the indicator functions $X_0$, $X_1$, $X_2$, $X_3$, $X_4$, where $X_j(x) = \begin{cases} 1 \text{ if } x \in X_j \\ 0 \text{ otherwise.} \end{cases}$ Logic equations for these functions are set forth in Table 5.

Table 6 lists the noncode trellis sequences for the preferred code implemented by the encoder logic of Table 3 and the partitioned trellis defined by FIG. 4 or by FIGS. 5 and 6. These are the 10-symbol codewords supported by the trellis which do not belong to the code. Table 7 sets forth Boolean logic for a flag variable that can be used to identify detector outputs that are invalid. This flag may be used to provide erasure information for the error recovery procedure used in the data storage system depicted in FIG. 1.

It will be understood that, if preferred, other methods known to those skilled in the art can be used to implement the logical functions of encoder 11 and decoder 14, such as a ROM-based lookup table approach or a lexicographical coding approach.

Apparatus for Implementation

Figure 11:
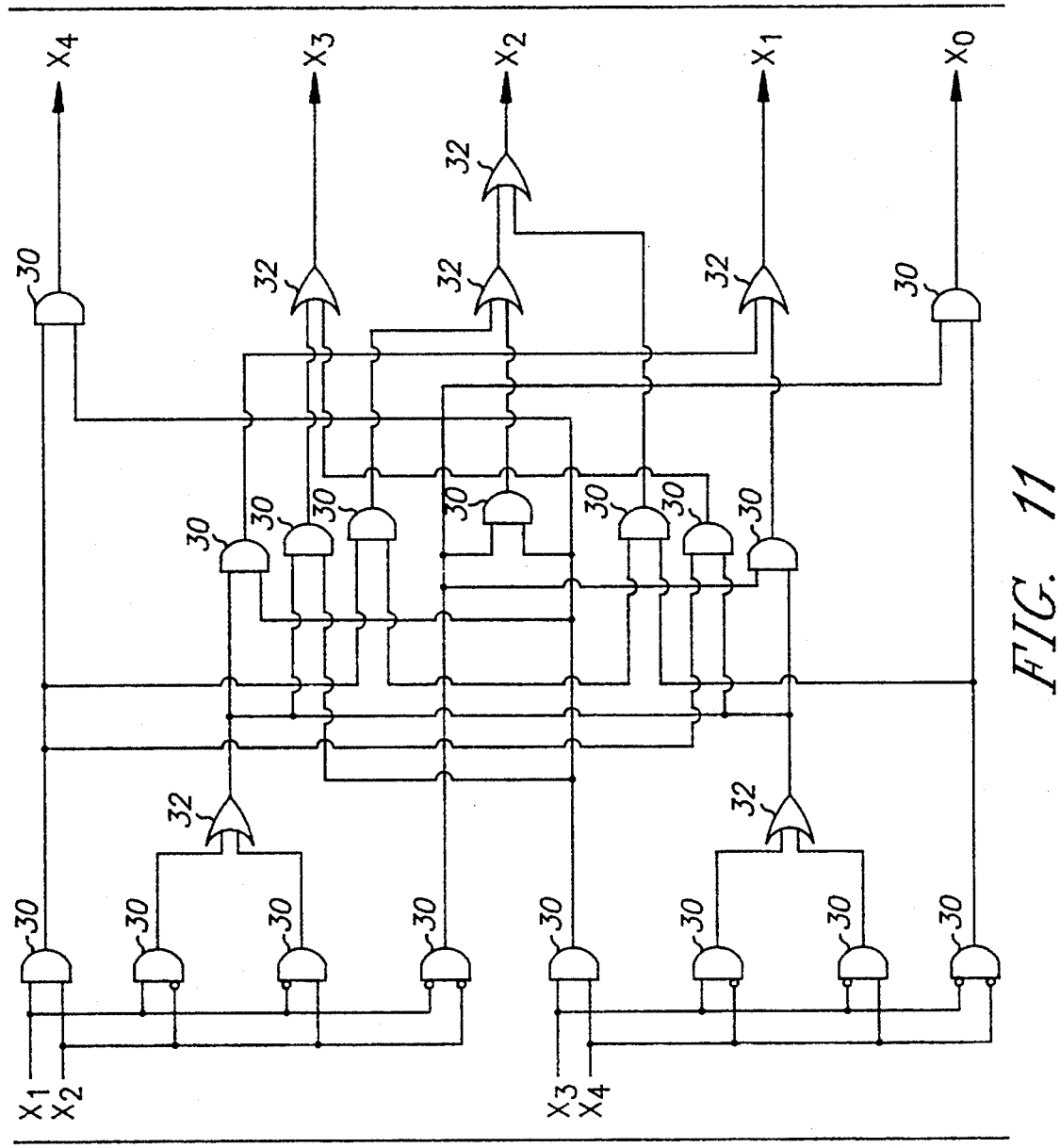
FIG. 11 is a schematic of the logic equations for the Hamming weight indicator functions used in the encoder and decoder.

As illustrated in FIG. 11, the encoder 11 and decoder 14 defined by Tables 3 and 4 comprise a plurality of two-input AND gates 30 and two-input OR gates 32, which implement the logic functions set forth in Table 5. Excluding the Hamming weight indicator functions, which add a total of approximately 50 gates 30,32, depending on the implementation, there are 307 for the encoder 11 and 235 for the decoder 14.

As earlier noted, the Viterbi detector 13 comprises branch metric circuits 16, ACS units 17, and an SMU 18 comprising a local SMU subunit (LSMU) 19 and a global SMU subunit (GSMU) 20.

Branch Metric Circuitry

The branch metric circuitry 16 may be identical with that disclosed in Reference [F] and hence will not be specifically described herein.

ACS Units

The six-state systolic trellis structure for the partitioned MSN code(s) requires six ACS units 17. To render the ACS topology and branch metric connections "time invariant", the six ACS units are interconnected so as to cyclically rotate assignment of each of the six output states by a preselected integer n. Applicants determined that this integer n for a particular code should be equal to the quotient obtained by dividing the number of RDS states by a number that is divisible into the codeword length. Thus, for a rate 8/10 code with six states and a 10-bit codeword length, the assignment should be cyclically rotated by 3 because 6/3=2, which is divisible into 10.

Figure 12:
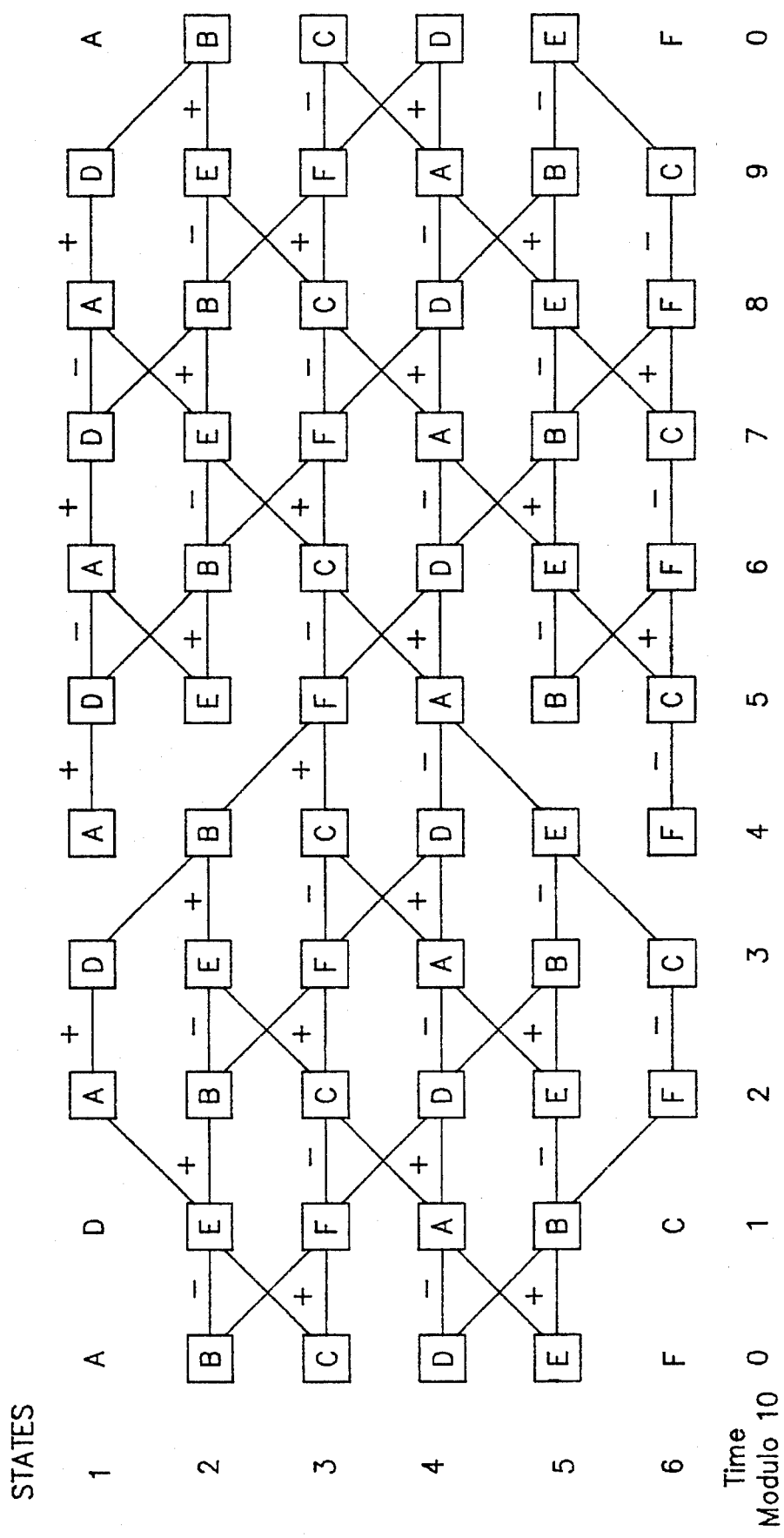
FIG. 12 depicts the trellis structure of FIG. 5 with states assigned to physical Add-Compare-Select (ACS) units according to a cyclic rotate-by-three rule.

Referring now to FIG. 12, the trellis states at each stage are numbered 1, 2, 3, 4, 5, and 6 (top-to-bottom), and the ACS units 17 are denoted by A, B, C, D, E, and F. FIG. 12 describes the preferred cyclical, rotate-by-three assignment of output states. This assignment preserves the branch metric inputs at each ACS unit 17.

When applied to the six-state systolic RDS trellis, and as hereinafter more fully described, this rotate-by-three assignment eliminates the need for input multiplexers (MUXs) except when computing metrics for states 1 and 6. In effect, the survivor metrics for a given state are computed alternately by a pair of ACS units 17; e.g., the survivor metric for state 1 is generated alternately by ACS units A and D. Edge labels 0, +1, and −1 are denoted by blank, +, and −, respectively.

The time-variation of the vertically compressed trellis is preferably implemented by means of an ACS-override feature, controllable by programmable bits, which can force a predetermined decision and corresponding update to the survivor metric and survivor path.

Figure 13:
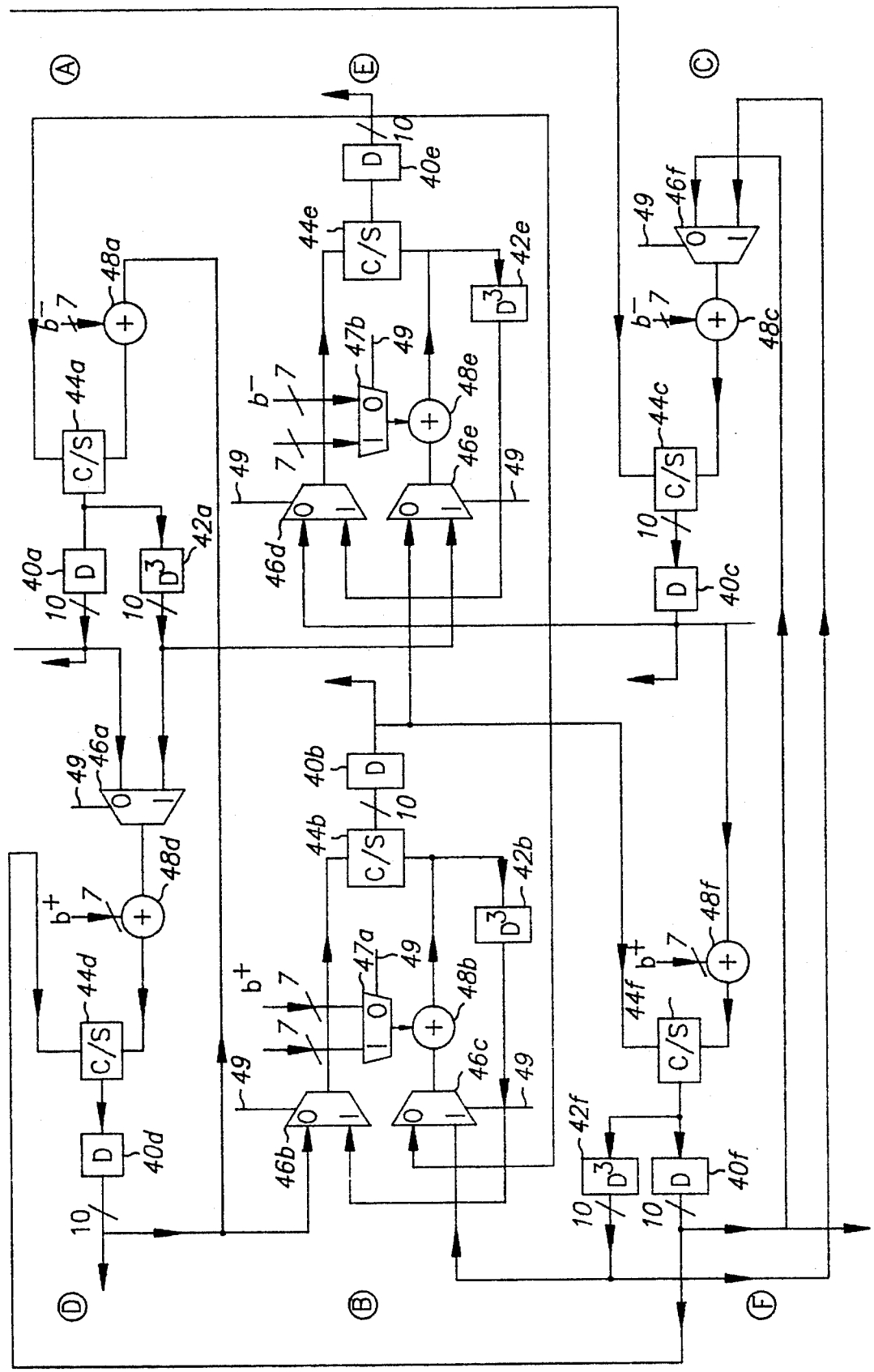
FIG. 13 is a schematic diagram showing interconnections of the ACS units specified by the state-to-ACS assignments of FIG. 12.

FIG. 13 illustrates an apparatus, including six interconnected ACS units 17A–E, for achieving the rotate-by-three assignment of output states. This apparatus comprises six one-cycle delay units 40a–f, four three-cycle delay units 42a,b,e,f, six compare select units (C/S) 44a–f, six MUXs 46a–f, and six adders 48a–f. Delay units 40a,42a and 40f,42f at the output of ACS units A and F, in combination with MUXs 46a and 46f at the inputs of ACS units D and C perform an auxiliary trellis computation. This computation is required for states 1 and 6 at time 4 modulo 10. It is combined with the branch metric supplied to adders 48d,c when MUXs 46a,f are triggered by a signal on line 49 at time 5 modulo 10 to provide the correct survivor metrics for states 1 and 6 at time 5 modulo 10. In addition, delay units 40a–f and three-cycle delay units 42a,b,e,f, together with MUXs 46b,c,d,e and branch metric MUXs 47a,b applied to adders 48a,e perform another auxiliary trellis computation that is required for states 2 and 5 at time 5 modulo 10. MUXs 46b,c,d,e and MUXs 47a,b are also triggered by a signal on line 49 at time 5 modulo 10.

Figure 14:
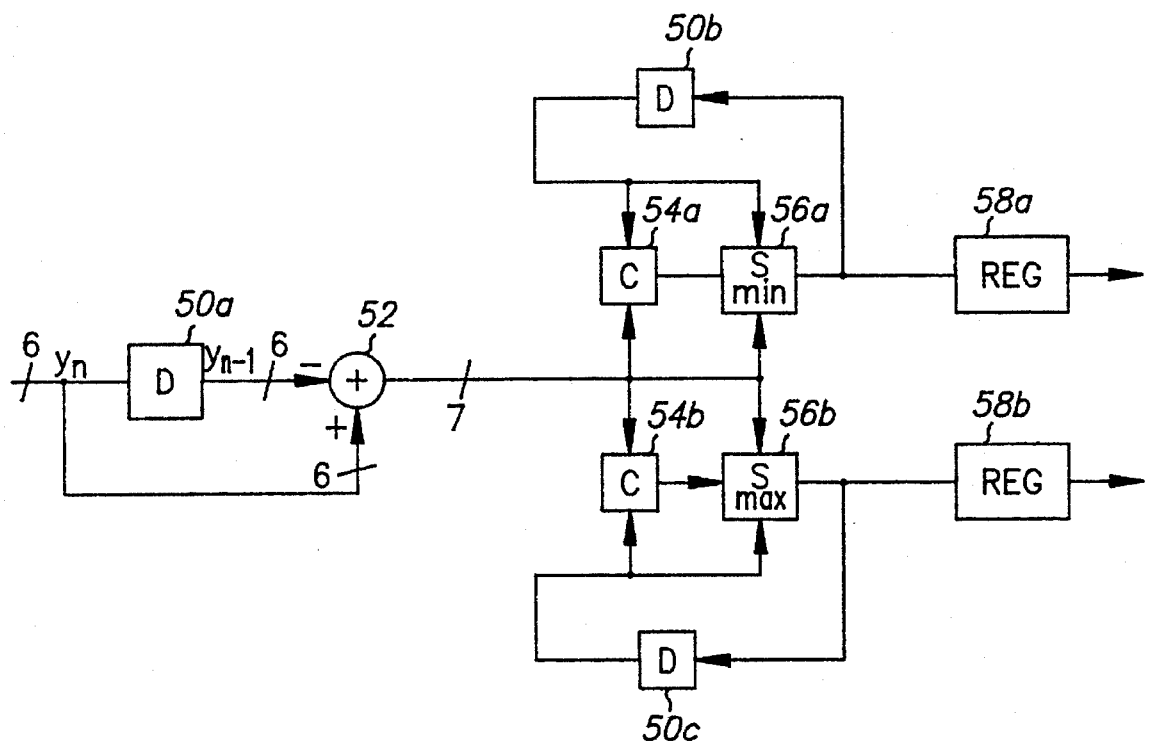
FIG. 14 is a schematic diagram showing how an auxiliary survivor computation is performed using the auxiliary trellis structure of FIG. 6.

FIG. 14 illustrates a circuit that may be used to execute simultaneously the maximization and minimization required for the complementary auxiliary survivor metric computation; namely:

$$\max\{y_3-y_2, y_4-y_3, y_5-y_4\}$$

and $$\min\{y_3-y_2, y_4-y_3, y_5-y_4\}$$

Delay unit 50a and subtractor 52 generate quantities $y_n-y_{n-1}$, at successive instants. At each instant, the quantity $y_n-y_{n-1}$ is supplied to compare units 54a and 54b. Delay units 50b and 50c additionally supply the minimum and maximum, respectively, of the previously computed differences $y_j-y_{j-1}$ to the compare units 54a and 54b, respectively. Selector units 56a and 56b then generate the minimum and maximum, respectively, of the quantities supplied to compare units 54a and 54b, respectively. The new minimum and maximum, respectively, are then fed back via delay units 50b and 50c, respectively. The recursively computed minimum and maximum quantities are supplied to registers 58a and 58b for use in the auxiliary trellis computation.

Survivor (Path)/Memory Unit (SMU)

An SMU of 30-bits depth achieves virtually all of the available coding gain for the partitioned code. The SMU 18 is preferably organized as the local and global subunits LSMU 19 and GSMU 20, respectively (FIG. 1). The LSMU 19 processes the most recent 10-bit codeword, while the GSMU 20 accommodates the preceding 20 bits.

Local SMU (LSMU)

The LSMU 19 stores survivor information based on the most recently received samples for the six states in the RDS trellis structure over a period of 10 bits. LSMU 19 can be organized using variations of one of the following methods:
1) Modified Register Exchange If the register exchange method is used, registers and multiplexers are suitably interconnected to reflect the interconnection of the detector trellis. Auxiliary trellis survivor sequences are mapped into the appropriate registers in the LSMU at times 5 modulo 10. A key feature of the method is that the survivor sequences are directly stored in the LSMU; no subsequent decoding is required.

Figure 15:
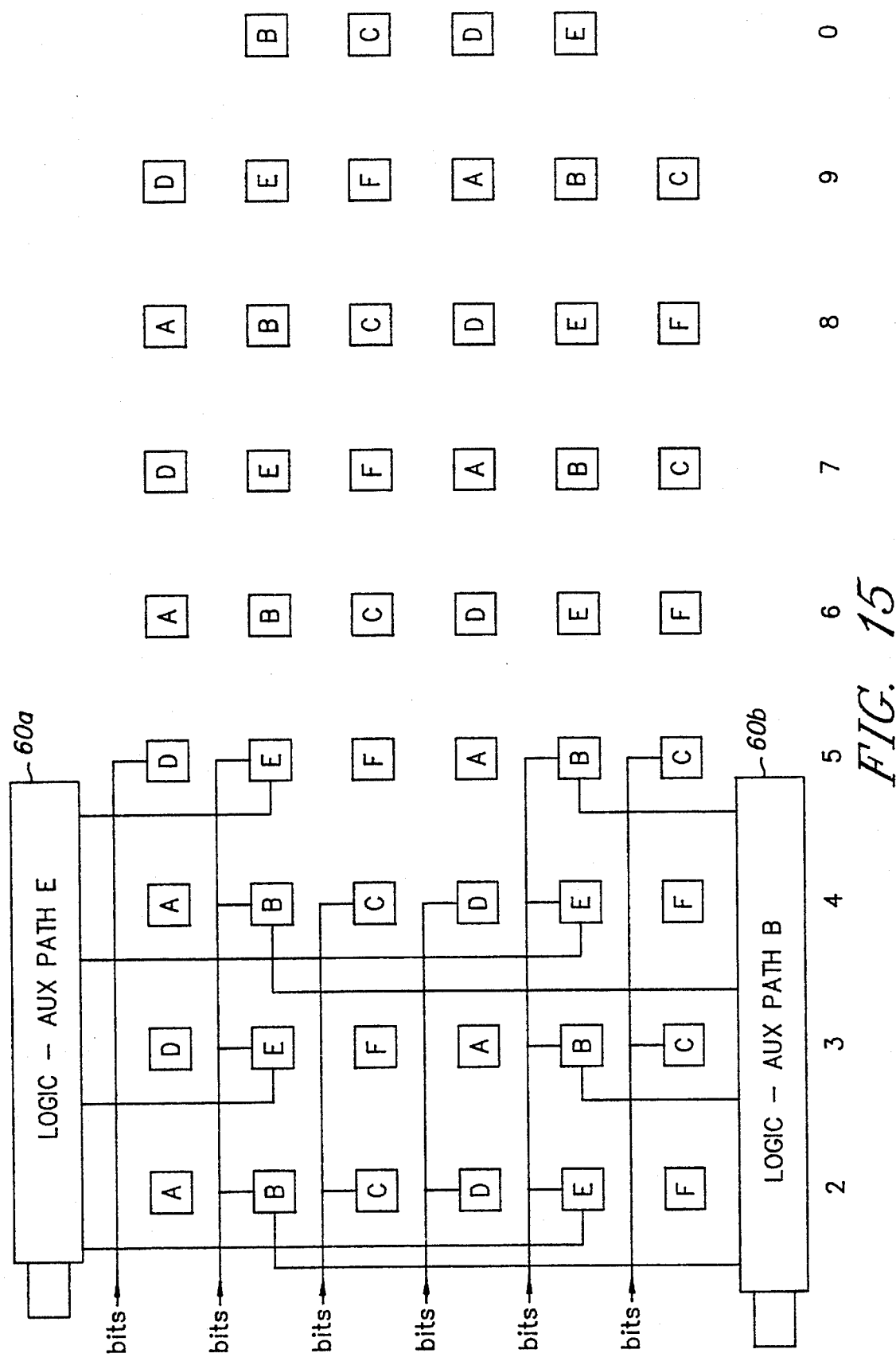
FIG. 15 is a schematic diagram showing a modified register exchange technique for a local Survivor Memory Unit (SMU)

FIG. 15 shows circuitry for a modified register exchange implementation of LSMU which provides the substitution of auxiliary trellis survivor sequences at times 5 modulo 10 for states 2 and 5, as well as the substitutions for states 1 and 6 at time 5 modulo 10. The register labels A–F correspond to the ACS units assigned to the states 1–6 in the trellis, as in FIG. 12.

The systolic interconnections between the registers, as determined by the systolic trellis structure, are omitted for simplification. The auxiliary sequences are mapped into the local memory, depending on the ACS decisions at time 5 modulo 10 and the output of the logic units 60a and 60b for states 2 and 5, respectively.

2) Traceback Method

Use of the traceback method largely avoids the use of 1-bit registers and a multiplexer between each register, and reduces significantly the wiring and the interconnection requirements. Shift registers store the "ancestor" state information, which is subsequently decoded to derive the survivor sequences. The length of the shift register depends upon the traceback configuration used.

Figure 16:
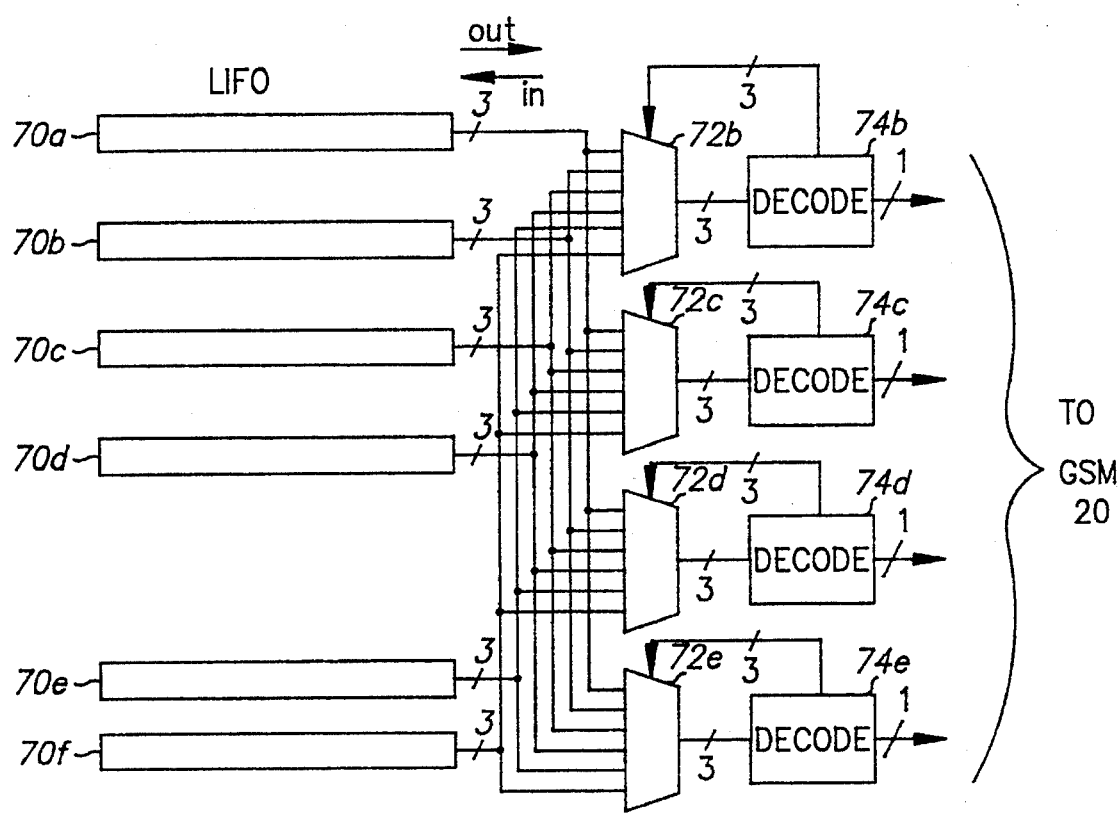
FIG. 16 is a schematic diagram of a local SMU incorporating one traceback method with 3-bit ancestor state representation.

The following approaches may be employed to implement the traceback method in the LSMU:

(a) FIG. 16 illustrates an implementation using a 3-bit Ancestor State Representation. LSMU 19 stores the most recent ancestor state information in six last-in-first-out (LIFO) 30-bit shift registers 70a–f based on the updated outputs from the ACS units 17. Since there are six possible intermediate states, a 3-bit word is required to identify the ancestor state uniquely at each time instant. At the end of ten most recent updates, the contents of the shift registers are used to traceback the survivor sequences for each of the four originating and terminating charge states in the partitioned code. In addition to the six 30-bit shift registers 70a–f needed to store the ancestor state information, four six-way multiplexers 72b–e and four decoding logic units 74b–e, corresponding to the four terminating charge states and their ACS units B–E are required. Use of a 30-bit buffer can be avoided by using the LIFO arrangement in the shift registers.

Figure 17:
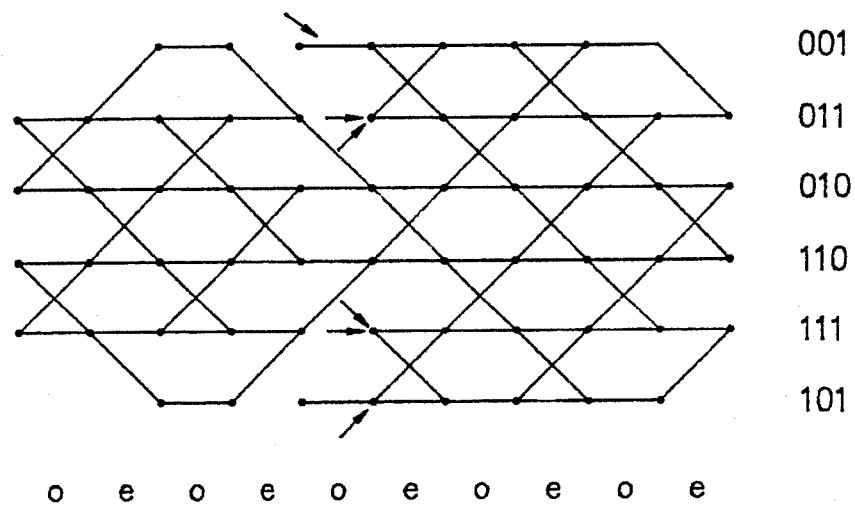
FIG. 17 depicts the vertically compressed trellis structure of FIG. 5 with even and odd stages indicated, along with 3-bit state identifiers.

(b) In the trellis for the partitioned code shown in FIG. 17, the time instants are identified by "e"(even) and "o"(odd) labels. Note that the ancestor for a given state comes from either the same state, or one below or above it. If the identity of the "above" and the "below" states is ignored for the present, it will be noted that one bit of information is required to identify the ancestor state. Thus, a "0" may represent the case where the ancestor state and the current state are the same, and a "1" may represent the case where the ancestor state differs from the current state. The ambiguity associated with the "different" state is easily resolved by the time instant labels. For example, examine the state labelled 011. During "e" time instants, the "different" state is always the one above 011; and during the "o" instants, it is the opposite. Similarly, for the other states. Thus, instead of using 3-bit state labels, only 1-bit labels are needed in the LSMU.

Figure 18:
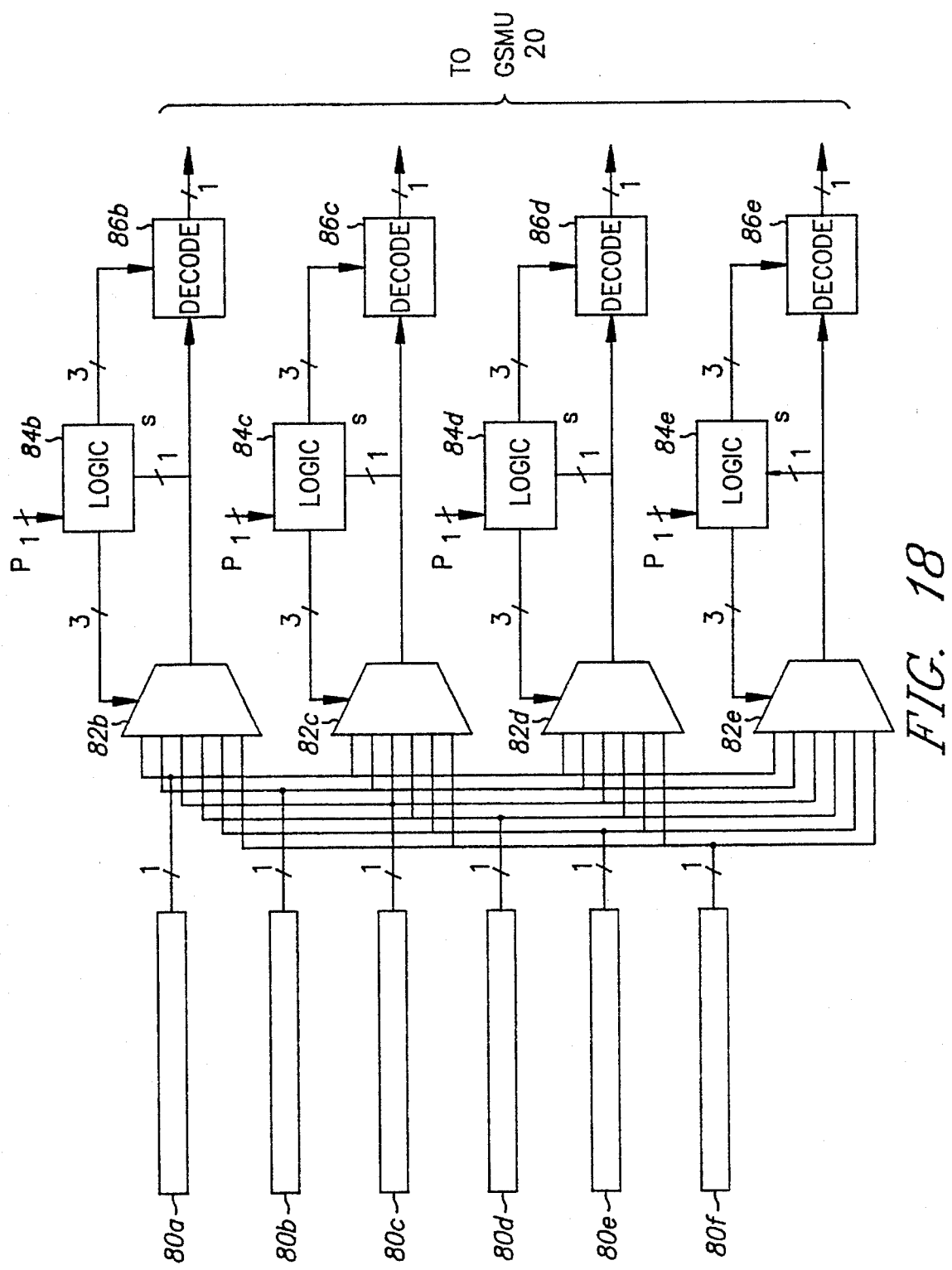
FIG. 18 is a schematic diagram of a local SMU incorporating an alternative traceback method with 1-bit "differential" state identifiers and an even-odd phase identifier.

As illustrated in FIG. 18, only six 10-bit shift registers 80a–f are required to store the partial information about the ancestor states. The logic blocks 84b–e (which could also be implemented with a 16×4 lookup table) combine this information with an independently generated "phase identifier" signal p and the previous predecessor state s to identify the new predecessor state. The previous predecessor state information bit s and the 3-bit state identifier are supplied to decode blocks 86b–e which then generate a decoded bit to be stored in the codeword registers of the GSMU 20. As in the notation convention used in FIG. 18, the four MUXs 82b–e, predecessor state logic blocks 84b–e, and symbol decode logic blocks 86b–e have labels corresponding to the four terminating charge states with their ACS units B–E.

FIGS. 17 and 18 thus illustrate a 1-bit Ancestor State Representation, in which the size of LSMU 19 and buffering requirement can be significantly reduced by storing "differential" state information. Table 8 depicts the required state transitions for the approach illustrated in FIG. 18. The state labels are arbitrary and may be arranged to minimize the required logic.

Global SMU (GSMU)

The survivor sequences from LSMU 19 are loaded into GSMU 20. Since loading is performed on a 10-bit basis, GSMU 20 must necessarily make use of traceback method to generate the detected codewords.

Figure 19:
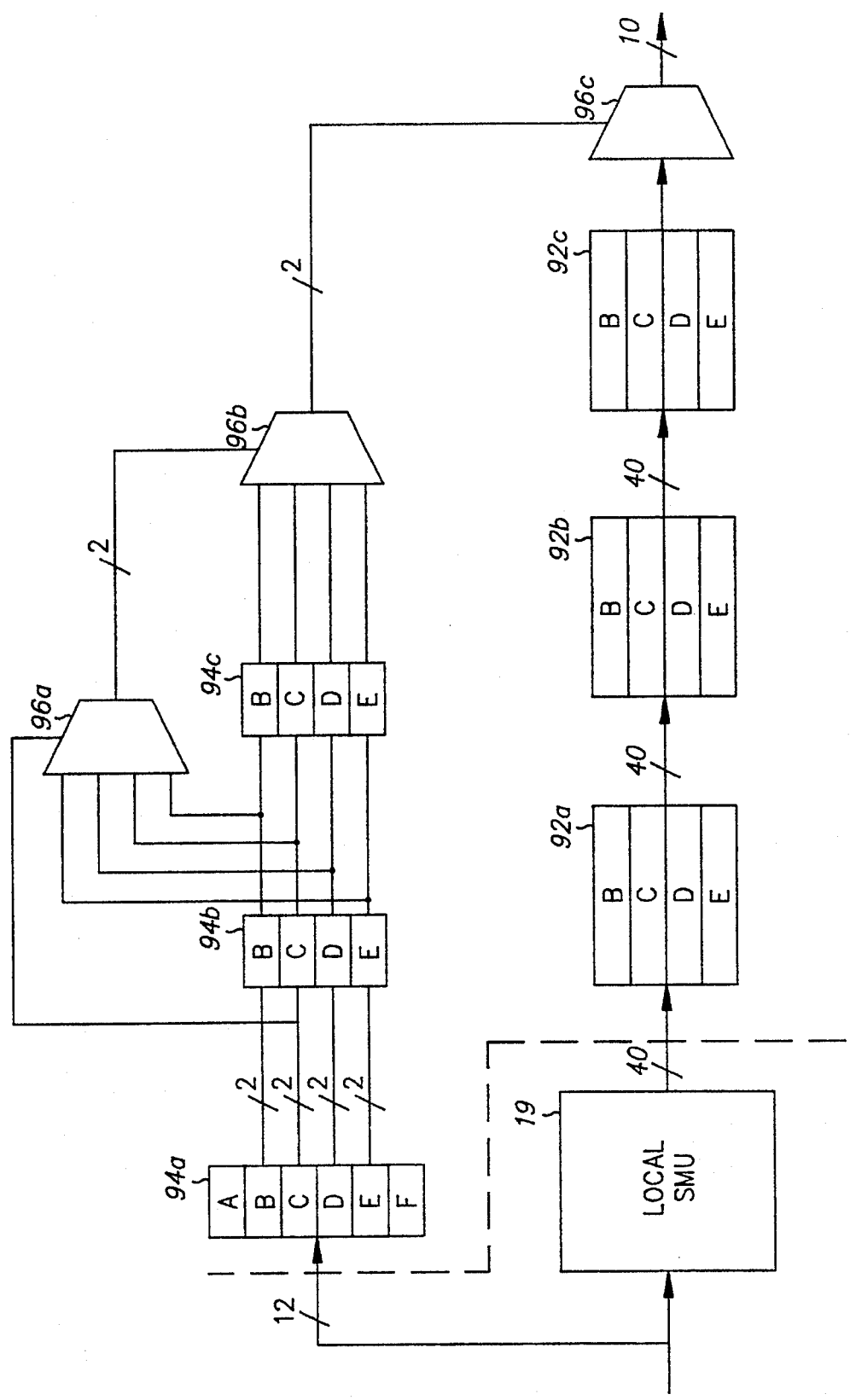
FIG. 19 is a schematic diagram of a global SMU incorporating a codeword-length traceback method for generating maximum likelihood codeword estimates.

FIG. 19 shows an apparatus for implementing the GSMU traceback function. Depth-four stacks of 10-bit survivor registers 92a,b,c contain the four survivor sequences of length 30 bits for states 2,3,4 and 5; with the most recent 10-bit survivor extensions supplied to stack 92a by LSMU 19.

A parallel set of stacks of 2-bit pointer registers 94a,b,c provide the traceback pointer information. The traceback proceeds as follows:

A trellis boundary state is selected arbitrarily, here taken to be state C. The 2-bit traceback pointer in the corresponding register in pointer stack 94a is supplied to MUX 96a. This pointer designates the predecessor trellis-boundary state for the initial state C. MUX 96a then selects from the predecessor state register in stack 94b the 2-bit pointer for that state and supplies it to MUX 96b. MUX 96b then selects, from the corresponding pointer register in stack 94c, the 2-bit pointer which, when supplied to MUX 96c, causes GSMU 20 to output the 10-bit sequence in the corresponding register in survivor sequence stack 92c as the next 10 bits of the maximum likelihood sequence estimate. This process is repeated after every 10 cycles of ACS operation when LSMU 19 has computed the 10-bit extensions of the survivor sequences and shifted them into the survivor register stack 92a.

While the invention has been described as implemented with the rate 8/10 code depicted in FIG. 2, it will be understood by those skilled in the art that the invention may also readily be implemented with the rate 8/10 code depicted in FIG. 3 by using a vertically compressed systolic trellis structure substantially like that shown in FIG. 5, but deleting from FIG. 5 all edges entering or leaving the states $-2_0$ and $+2_1$ at time 5.

It will also be understood that the candidate codewords of a partitioned trellis code may be defined by a configuration of concatenated subsets of sequences with specified RDS values where the concatenated sequences have unequal lengths which sum to the codeword length. In other words, the codewords may be constrained to assume at the end and at one or more prespecified locations within each codeword (not necessarily equidistant from both ends of the codewords) subsets of permissible RDS values prescribed by an initial RDS value. The selection of sequence lengths may be varied to achieve various tradeoffs between code rate, run-length constraints, RDS constraints, path memory length, and code/detector complexity.

While the invention, for sake of illustration, has been shown and described as applied to two specific rate 8/10 codes, it will be apparent that the invention may be applied to other RLL codes, and that various changes in detail may be made without departing from the scope and teaching of the invention. Accordingly, the methods and apparatus herein described are to be considered as merely illustrative, and the invention is to be limited only as specified in the claims.

APPENDIX

TABLE 1: Excluded Sequences

|  | Candidate Codewords | Mapped Datawords |
|---|---|---|
| $A_1A_{-1}$ | (28,3)<br>(7,24) | (12,3)<br>(8,7) |
| $A_3A_{-1}$ | (30,3)<br>(15,24)<br>(23,24)<br>(27,24)<br>(29,24)<br>(30,24) | (15,3)<br>(7,7)<br>(11,7)<br>(13,7)<br>(14,7)<br>(15,7) |
| $A_3A_{-3}$ | (30,1)<br>(15,16) | (15,0)<br>(7,8) |
| $A_1A_1$ | (7,28)<br>(28,7) | (8,12)<br>(12,8) |

TABLE 2: Discarded Sequences

|  | Candidate Codewords | Mapped Datawords |
|---|---|---|
| $A_1A_{-1}$ | (7,3)<br>(28,24) | (8,3)<br>(12,7) |
| $A_3A_{-1}$ | (30,12) | (15,12) |
| $A_1A_1$ | (7,7)<br>(25,7)<br>(25,28)<br>(28,28) | -<br>-<br>-<br>- |

TABLE 3: Encoder Logic

```
    ∇ENC2F[☐]∇
[0]   C←ENC2F D;B;S;T;X0;X1;X2;X3;X4;Y0;Y1;Y2;Y3;Y4;X;Y;F;G;H;I;J;K;E1;E2;E;U
    ;V
    ;W;CODE
[1]   ⍝
[2]   ⍝   Encoder function for rate 8/10 MSN 2-flat code.
[3]   ⍝
[4]   ⍝   Function input parameter D =  data bits to be encoded
[5]   ⍝   The function output C is the sequence of code bits.
[6]   ⍝
[7]   ⍝   The logic equations describe encoder output and next state
[8]   ⍝   for state 0. The outputs and next state for state 1 are
[9]   ⍝   obtained by complementing.
[10]  ⍝
[11]   C←T←S←0/1
[12]  ⍝
[13]  ⍝INITIALIZE STATE TO S=0
[14]  ⍝
[15]   S←0
[16]  ⍝
[17]  ⍝  Encoding iteration
[18]  ⍝
[19]  ITERATE:
[20]  ⍝
[21]   →(8>⍴D)/END
[22]  ⍝
[23]   ' '
[24]   ' '
[25]   'STATE= ',S
[26]  ⍝
[27]   B←8↑D
[28]   X←4↑B
[29]   Y←¯4↑B
[30]   'X= ',X
[31]   'Y= ',Y
[32]   'DATA= ',((4⍴2)⊥X),' ',((4⍴2)⊥Y)
[33]   D←8↓D
[34]  ⍝
[35]  ⍝ Compute Hamming weight indicator functions
[36]  ⍝ for first and second data nibbles
[37]  ⍝
[38]   X0←(0=+/4↑B)
[39]   X1←(1=+/4↑B)
[40]   X2←(2=+/4↑B)
[41]   X3←(3=+/4↑B)
[42]   X4←(4=+/4↑B)
[43]  ⍝
[44]   Y0←(0=+/¯4↑B)
[45]   Y1←(1=+/¯4↑B)
[46]   Y2←(2=+/¯4↑B)
[47]   Y3←(3=+/¯4↑B)
[48]   Y4←(4=+/¯4↑B)
[49]  ⍝
[50]   'WEIGHT INDICATORS '
[51]   (2 5)⍴(⊂'X0'),(⊂'X1'),(⊂'X2'),(⊂'X3'),(⊂'X4'),X0,X1,X2,X3,X4
[52]   (2 5)⍴(⊂'Y0'),(⊂'Y1'),(⊂'Y2'),(⊂'Y3'),(⊂'Y4'),Y0,Y1,Y2,Y3,Y4
[53]  ⍝
[54]  ⍝  Compute "exceptional set" indicator functions
[55]  ⍝
[56]   E1←(X3∨X4∨(X1∧X[1])∨(X2∧X[1]∧X[2]))∧Y3∧~Y[1]
[57]  ⍝
[58]   E2←(X3∧(~X[1])∧Y1∧Y[1])∨(X4∧Y0)∨(X1∧X[1]∧Y2∧Y[3]∧Y[4])
[59]   E2←E2∨(X2∧X[1]∧X[2]∧Y2∧Y[3]∧Y[4])∨(X4∧Y2∧Y[3]∧Y[4])
[60]   E2←E2∨(X4∧Y2∧Y[1]∧Y[2])∨(X0∧Y4)
[61]   E←E1∨E2
[62]  ⍝
```

```
[63]   'EXCEPTION INDICATORS '
[64]   (2 3)ρ(⊂'E1'),(⊂'E2'),(⊂'E'),E1,E2,E
[65]  ⍝
[66]  ⍝
[67]  ⍝  Compute partitions
[68]  ⍝
[69]   F←((X1∨X2)∧(Y2∨Y3))∨((X3∨X4)∧~Y4)
[70]   G←(X1∨X2)∧(Y0∨Y1)
[71]   H←X0∧(Y0∨Y1)
[72]   I←(X3∨X4)∧Y4
[73]   J←X0∧(Y2∨Y3)
[74]   K←Y4∧(X1∨X2)
[75]  ⍝
[76]   'PARTITION INDICATORS '
[77]   (2 6)ρ(⊂'F'),(⊂'G'),(⊂'H'),(⊂'I'),(⊂'J'),(⊂'K'),F,G,H,I,J,K
[78]  ⍝
[79]  ⍝  Define output bits and next state
[80]  ⍝
[81]   U←5ρ0
[82]   V←5ρ0
[83]  ⍝
[84]   U[1]←(~E)∧(F∧(X2∨(X3∨X4)∧X[1]))
[85]   U[1]←U[1]∨(~E)∧(G∧X2)
[86]   U[1]←U[1]∨(~E)∧(H∧(Y0∨Y1∧(Y[1]∨Y[3])))∨(I∧X3∧X[1])
[87]   U[1]←U[1]∨(~E)∧(J∧Y2)∨(K∧X2)
[88]  ⍝
[89]   U[2]←(~E)∧(F∧(X1∧~X[1])∨(X2∧X[1])∨((X3∨X4)∧X[2]))
[90]   U[2]←U[2]∨(~E)∧(G∧(X1∧~X[1])∨(X2∧X[1]))
[91]   U[2]←U[2]∨(~E)∧(H∧(Y1∧~Y[3]))∨(I∧X4∨X3∧~X[3]∧X[4])
[92]   U[2]←U[2]∨(~E)∧(J∧Y[1])∨(K∧(X1∧~X[1])∨X2∧X[1])
[93]  ⍝
[94]   U[3]←(~E)∧(F∧(X1∧~X[2])∨(X2∧X[2])∨((X3∨X4)∧X[3]))
[95]   U[3]←U[3]∨(~E)∧(G∧(X1∧~X[2])∨(X2∧X[2]))
[96]   U[3]←U[3]∨(~E)∧(H∧Y0∨Y1∧(Y[2]∨Y[3]))∨(I∧X4∨X3∧~X[1]∧X[4])
[97]   U[3]←U[3]∨(~E)∧(J∧Y[2])∨(K∧(X1∧~X[2])∨X2∧X[2])
[98]
[99]  ⍝
[100]  U[4]←(~E)∧(F∧(X1∧~X[3])∨(X2∧X[3])∨((X3∨X4)∧X[4]))
[101]  U[4]←U[4]∨(~E)∧(G∧(X1∧~X[3])∨(X2∧X[3]))
[102]  U[4]←U[4]∨(~E)∧(H∧Y1∧~Y[2])∨(I∧X4∨X3∧~X[1]∧X[2])
[103]  U[4]←U[4]∨(~E)∧(J∧Y[3])∨(K∧(X1∧~X[3])∨X2∧X[3])
[104] ⍝
[105]  U[5]←(~E)∧(F∧(X1∧~X[4])∨(X2∧X[4])∨X3)
[106]  U[5]←U[5]∨(~E)∧(G∧(X1∧~X[4])∨(X2∧X[4]))
[107]  U[5]←U[5]∨(~E)∧(H∧Y0∨Y1∧(Y[2]∨Y[4]))∨(I∧X3∧X[4])
[108]  U[5]←U[5]∨(~E)∧(J∧Y[4])∨(K∧(X1∧~X[4])∨X2∧X[4])
[109] ⍝
[110] ⍝
[111]  V[1]←(~E)∧(F∧Y3∨(Y1∨Y0)∧Y[1])
[112]  V[1]←V[1]∨(~E)∧(G∧Y0∨Y1∧(Y[1]∨Y[3]))
[113]  V[1]←V[1]∨(~E)∧J∨K
[114] ⍝
[115]  V[2]←(~E)∧(F∧(Y3∧~Y[1])∨(Y2∧Y[1])∨((Y1∨Y0)∧Y[2]))
[116]  V[2]←V[2]∨(~E)∧(G∧Y1∧~Y[3])
[117]  V[2]←V[2]∨(~E)∧H∨I
[118]  V[2]←V[2]∨(~E)∧J
[119] ⍝
[120]  V[3]←(~E)∧(F∧(Y3∧~Y[2])∨(Y2∧Y[2])∨((Y1∨Y0)∧Y[3]))
[121]  V[3]←V[3]∨(~E)∧(G∧Y0∨Y1∧(Y[2]∨Y[3]))
[122]  V[3]←V[3]∨(~E)∧H∨I
[123] ⍝
[124]  V[4]←(~E)∧(F∧(Y3∧~Y[3])∨(Y2∧Y[3])∨((Y1∨Y0)∧Y[4]))
[125]  V[4]←V[4]∨(~E)∧(G∧Y1∧~Y[2])
[126]  V[4]←V[4]∨(~E)∧H∨I
[127]  V[4]←V[4]∨(~E)∧K
[128] ⍝
[129]  V[5]←(~E)∧(F∧(Y3∧~Y[4])∨(Y2∧Y[4])∨Y0)
[130]  V[5]←V[5]∨(~E)∧(G∧Y0∨Y1∧(Y[2]∨Y[4]))
[131]  V[5]←V[5]∨(~E)∧J∨K
[132] ⍝
[133] ⍝
```

```
[134]⍝ Encode exceptional words
[135]⍝
[136]   U[1]←U[1]∨(E1∧~X3∧X[1])
[137]   U[1]←U[1]∨(E2∧X2∨X4)
[138]⍝
[139]   U[2]←U[2]∨(E1∧X3)
[140]   U[2]←U[2]∨(E2∧X0∨X1∨X3∨X4∧Y[1])
[141]⍝
[142]   U[3]←U[3]∨(E1∧X1∨X2∨(X3∧X[1]∧X[2]))
[143]   U[3]←U[3]∨(E2∧X1∨X3∨X4∧~Y[1])
[144]⍝
[145]   U[4]←U[4]∨(E1∧X2∨X4∨X3∧X[3])
[146]   U[4]←U[4]∨(E2∧X0∨X1∨X2∨X4∧Y2)
[147]⍝
[148]   U[5]←U[5]∨(E1∧X1∨X4∨X3∧~X[2]∧X[3])
[149]   U[5]←U[5]∨(E2∧X0∨X2∨X3∨Y0)
[150]⍝
[151]⍝
[152]   V[1]←V[1]∨E2
[153]⍝
[154]   V[2]←V[2]∨E2
[155]⍝
[156]   V[3]←V[3]∨E1∨E2
[157]⍝
[158]   V[4]←V[4]∨E1
[159]⍝
[160]   V[5]←V[5]∨E1
[161]⍝
[162]⍝ Form codeword as function of state S
[163]⍝ (complement if S=1)
[164]⍝
[165]
[166]   U←(2|S+U)
[167]   V←(2|S+V)
[168]   W←(U,V)
[169]⍝
[170]   'W = ',W
[171]   CODE←((5⍴2)⊥U),((5⍴2)⊥V)
[172]   'CODE= ',((5⍴2)⊥U),',',((5⍴2)⊥V)
[173]
[174]⍝
[175]⍝ Form next state
[176]⍝ (complement if S=1)
[177]⍝
[178]   T←E∨~((X1∨X2)∧(Y2∨Y3))∨((X3∨X4)∧(Y0∨Y1))
[179]   T←(2|S+T)
[180]⍝
[181]   'NEXT STATE= ',T
[182]⍝
[183]⍝
[184]⍝ Add new codeword to code sequence
[185]⍝
[186]   C←C,W
[187]   TS←TS,T
[188]
[189]
[190]⍝
[191]⍝ For test of encoder, set S = 0 or 1
[192]⍝
[193]⍝S←0
[194]⍝
[195]⍝ Update state
[196]⍝
[197]   S←T
[198]
[199]   →ITERATE
[200]END:
       α 1992-12-19  0.42.01 (GMT-7)
```

TABLE 4: Decoder Logic

```
        ∇DEC2F[□]∇
     ∇
[0]    D←DEC2F C;X;Y;U;V;W;U0;U1;U2;U3;U4;U5;V0;V1;V2;V3;V4;V5;E1;E2;F1;F2;F3;
G;
H;I;J;K;L;M;N;L1;L2;R;S
[1]    ⍝
[2]    ⍝   Decoder function for rate 8/10 MSN 2-flat code.
[3]    ⍝
[4]    ⍝   Function input parameter C =  code bits to be decoded
[5]    ⍝   The function output D is the sequence of data bits.
[6]    ⍝
[7]    ⍝
[8]     D←FLAGS←0/1
[9]     X←Y←4⍴0
[10]   ⍝
[11]   ⍝   Decoding iteration
[12]   ⍝
[13]   ITERATE:
[14]   ⍝
[15]    →(10>⍴C)/END
[16]   ⍝
[17]   ⍝
[18]    W←10↑C
[19]    U←5↑W
[20]    V←⁻5↑W
[21]    'U= ',U
[22]    'V= ',V
[23]    'CODE= ',((5⍴2)⊥U),',',((5⍴2)⊥V)
[24]    C←10↓C
[25]   ⍝
[26]   ⍝ INVERT WORD IF U1 OR U2 ARE INDICATED
[27]   ⍝
[28]    U1←(1=+/U)
[29]    U2←(2=+/U)
[30]    →(~U1∨U2)/NOINVERT
[31]    U←~U
[32]    V←~V
[33]    W←~W
[34]    'INVERT =',1
[35]    →WEIGHTS
[36]   NOINVERT:
[37]    'INVERT =',0
[38]   ⍝ Compute Hamming weight indicator functions
[39]   ⍝ for first and second quibbles.
[40]   ⍝
[41]   WEIGHTS:
[42]    U0←(0=+/U)
[43]    U1←(1=+/U)
[44]    U2←(2=+/U)
[45]    U3←(3=+/U)
[46]    U4←(4=+/U)
[47]    U5←(5=+/U)
[48]   ⍝
[49]    V0←(0=+/V)
[50]    V1←(1=+/V)
[51]    V2←(2=+/V)
[52]    V3←(3=+/V)
[53]    V4←(4=+/V)
[54]    V5←(5=+/V)
[55]   ⍝
[56]    'WEIGHT INDICATORS'
[57]    (2 6)⍴(⊂'U0'),(⊂'U1'),(⊂'U2'),(⊂'U3'),(⊂'U4'),(⊂'U5'),U0,U1,U2,U3,U4,U5
[58]    ' '
[59]    (2 6)⍴(⊂'V0'),(⊂'V1'),(⊂'V2'),(⊂'V3'),(⊂'V4'),(⊂'V5'),V0,V1,V2,V3,V4,V5
[60]   ⍝
```

```
[61]  ⍝ Compute "exceptional set" indicator functions
[62]  ⍝
[63]   E1←U3∧V3∧(~V[1])∧(~V[2])
[64]  ⍝
[65]   E2←U3∧V3∧(~V[4])∧(~V[5])
[66]  ⍝
[67]   'EXCEPTION INDICATORS '
[68]   (2 2)⍴(⊂'E1'),(⊂'E2'),E1,E2
[69]  ⍝
[70]  ⍝
[71]  ⍝  Compute partitions
[72]  ⍝
[73]   F1←U3∧V2
[74]   F2←U4∧V2
[75]   F3←U4∧V1
[76]   R←V3∧~(V[1]∨V[3])∧(V[1]∨V[4])∧(V[2]∨V[4])∧(V[2]∨V[5])∧(V[3]∨V[5])
[77]   G←U3∧R
[78]   S←~U3∧(U[1]∨U[3])∧(U[1]∨U[4])∧(U[2]∨U[4])∧(U[2]∨U[5])∧(U[3]∨U[5])
[79]   H←S∧V3∧V[2]∧V[3]∧V[4]
[80]   I←(~S)∧V3∧V[2]∧V[3]∧V[4]
[81]   J←U3∧V3∧V[1]∧V[2]∧V[5]
[82]   K←U3∧V3∧V[1]∧V[4]∧V[5]
[83]   L←F1∨G∨K
[84]   M←F2∨F3
[85]   N←F1∨F2
[86]  ⍝
[87]   'PARTITION INDICATORS '
[88]   L1←(⊂'F1'),(⊂'F2'),(⊂'F3'),(⊂'G'),(⊂'H'),(⊂'I'),(⊂'J'),(⊂'K')
[89]   L2←F1,F2,F3,G,H,I,J,K
[90]   (2 8)⍴L1,L2
[91]  ⍝
[92]  ⍝  Define output bits
[93]  ⍝
[94]  ⍝
[95]   X[1]←(L∧(~U[1]∨U[2])∨(U[1]∧U[2]))∨(M∧U[1])∨(I∧U[1]∨U[2])
[96]   X[1]←X[1]∨(E1∧U[3]∨U[5])∨(E2∧(U[1]∨U[3])∧(U[1]∨U[4]))
[97]  ⍝
[98]   X[2]←(L∧(~U[1]∨U[3])∨(U[1]∧U[3]))∨(M∧U[2])∨(I∧U[2]∨U[3])
[99]   X[2]←X[2]∨(E1∧(U[2]∨U[4])∧(U[1]∨U[3]))∨(E2∧(U[1]∨U[3])∧(U[1]∨U[5]))
[100] ⍝
[101]  X[3]←(L∧(~U[1]∨U[4])∨(U[1]∧U[4]))∨(M∧U[3])∨(I∧U[3]∨U[4])
[102]  X[3]←X[3]∨(E1∧(U[2]∨U[4])∧(U[2]∨U[5])∧(U[1]∨U[4]))
[103]  X[3]←X[3]∨(E2∧(U[1]∨U[3])∧(U[1]∨U[5])∧(U[2]∨U[3]))
[104] ⍝
[105]  X[4]←(L∧(~U[1]∨U[5])∨(U[1]∧U[5]))∨(M∧U[4])∨(I∧U[4]∨U[5])
[106]  X[4]←X[4]∨(E1∧(U[2]∨U[4])∧(U[2]∨U[5])∧(U[1]∨U[5]))
[107]  X[4]←X[4]∨(E2∧(U[1]∨U[3])∧(U[1]∨U[5])∧(U[2]∨U[3]))
[108] ⍝
[109]  Y[1]←(N∧((~V[1])∧V[2])∨V[1]∧~V[2])∨(F3∧V[1])∨(G∧V[1]∧V[2])∨(H∧U[1]∧U[2])
[110]  Y[1]←Y[1]∨I∨(J∧U[2])∨K∨E2∧~(U[1]∨U[3])∧(U[1]∨U[4])∧(U[3]∨U[5])
[111] ⍝
[112]  Y[2]←(N∧((~V[1])∧V[3])∨V[1]∧~V[3])∨(F3∧V[2])∨(G∧V[2]∧V[3])∨(H∧U[2]∧U[3])
[113]  Y[2]←Y[2]∨I∨(J∧U[3])∨K∨E1∨E2∧~(U[1]∨U[3])∧(U[3]∨U[5])
[114] ⍝
[115]  Y[3]←(N∧((~V[1])∧V[4])∨V[1]∧~V[4])∨(F3∧V[3])∨(G∧V[3]∧V[4])∨(H∧U[3]∧U[4])
[116]  Y[3]←Y[3]∨I∨(J∧U[4])∨K∨E1∨E2∧(U[1]∨U[4])∧(U[2]∨U[4])∧(U[3]∨U[5])
[117] ⍝
[118]  Y[4]←(N∧((~V[1])∧V[5])∨V[1]∧~V[5])∨(F3∧V[4])∨(G∧V[4]∧V[5])∨(H∧U[4]∧U[5])
[119]  Y[4]←Y[4]∨I∨(J∧U[5])∨K∨E1∨E2∧(U[1]∨U[4])∧(U[2]∨U[4])∧(U[3]∨U[5])
[120]
[121]  'DATA= ',((4⍴2)⊤X),',',((4⍴2)⊤Y)
[122]
[123] ⍝
```

```
[124]⍝ Add decoded byte to data sequence
[125]⍝
[126] D←D,X,Y
[127]⍝
[128]⍝ Turn on invalid codeword flag for non-code sequences in trellis.
[129]⍝
[130] FLAG←U3∧(~(U[1]∨U[2])∧(U[3]∨U[4])∧(U[4]∨U[5]))∧V3∧~(V[1]∨V[2])∧(V[4]∨V[5])
[131] FLAG←FLAG∨U3∧(~(U[1]∨U[2])∧(U[4]∨U[5]))∧V2∧(V[1]∧V[2])∨(V[4]∧V[5])
[132] FLAG←FLAG∨U4∧(~U[5])∧((V1∧V[5])∨V2∧(V[2]∧V[3])∨V[4]∧V[5])
[133] FLAG←FLAG∨U4∧(~U[1])∧V1∧V[1]
[134]⍝
[135]⍝ Append flag to flag sequence
[136]⍝
[137] FLAGS←FLAGS,FLAG
[138]⍝
[139] →ITERATE
[140]END:
     ⍺ 1991-10-25 17.18.02 (GMT-7)

)OFF
CONNECTED 0.0.45
CPU TIME  0.0.0
```

TABLE 5: Hamming Weight Indicator Functions $$X_0 = \overline{x_1}\ \overline{x_2}\ \overline{x_3}\ \overline{x_4}$$

$$X_1 = \overline{x_1}\ \overline{x_2}\ (\overline{x_3}\ x_4 + x_3\ \overline{x_4}) + (\overline{x_1}\ x_2 + x_1\ \overline{x_2})\ \overline{x_3}\ \overline{x_4}$$

$$X_2 = \overline{x_1}\ \overline{x_2}\ x_3\ x_4 + (\overline{x_1}\ x_2 + x_1\ \overline{x_2})\ (\overline{x_3}\ x_4 + x_3\ \overline{x_4}) + x_1\ x_2\ \overline{x_3}\ \overline{x_4}$$

$$X_3 = (\overline{x_1}\ x_2 + x_1\ \overline{x_2})\ x_3\ x_4 + (x_1\ x_2)\ (\overline{x_3}\ x_4 + x_3\ \overline{x_4})$$

$$X_4 = x_1\ x_2\ x_3\ x_4$$

TABLE 6: Flag For NonCode Trellis Sequences

The following words and their complements are supported by the partitioned detector trellis but do not belong to the partitioned code.

| Binary | Decimal | RDS Sets |
|---|---|---|
| 00111.00011 | 7,3 | |
| 00111.11000 | 7,24 | $A_1 A_{-1}$ |
| 11100.00011 | 28,3 | |
| 11100.11000 | 28,24 | |
| 11110.00011 | 30,3 | $A_3 A_{-1}$ |
| 11110.01100 | 30,12 | |
| 11110.00001 | 30,1 | $A_3 A_{-3}$ |
| 01111.10000 | 15,16 | |
| 00111.00111 | 7,7 | |
| 00111.11100 | 7,28 | |
| 11001.00111 | 25,7 | $A_1 A_1$ |
| 11001.11100 | 25,28 | |
| 11100.00111 | 28,7 | |
| 11100.11100 | 28,28 | |

TABLE 7: Flag Logic (Assume that the decoder has inverted the word if $U_1=1$ or $U_2=1$)

$$FLAG = U_3 \cdot [\overline{u_1} \cdot \overline{u_2} + \overline{u_3} \cdot \overline{u_4} + \overline{u_4} \cdot u_5] \cdot V_3 \cdot [\overline{v_1}\, \overline{v_2} + \overline{v_4}\, \overline{v_5}]$$

$$+ U_3 \cdot [\overline{u_1} \cdot \overline{u_2} + \overline{u_4} \cdot \overline{u_5}] \cdot V_2\, [v_1\, v_2 + v_4\, v_5]$$

$$+ U_4 \cdot \overline{u_5} \cdot [V_1\, v_5 + V_2\, (v_2\, v_3 + v_4\, v_5)]$$

$$+ U_4 \cdot \overline{u_1} \cdot V_1 \cdot v_1$$

TABLE 8: State-Transition Table For LSMU

| $S_{n-1}$ | $P_n X_n$ | | | |
|---|---|---|---|---|
| | 00 | 01 | 11 | 10 |
| 000 | X | X | X | X |
| 001 | 001 | 011 | X | 001 |
| 011 | 011 | 001 | 010 | 011 |
| 010 | 010 | 110 | 011 | 010 |
| 110 | 110 | 010 | 111 | 110 |
| 111 | 111 | 101 | 110 | 111 |
| 101 | 101 | 111 | X | 101 |
| 100 | X | X | X | X |

$X$ = don't care
$P_n$ = phase identifier $\begin{cases} 0 \rightarrow e \\ 1 \rightarrow o \end{cases}$
$X_n$ = output of the LSMU register

We claim:

1. A method for detecting spectral null sequences of a spectrally-constrained code, comprising the steps of:

using an encoder, generating the spectral null sequences from digital electrical signals representing unencoded input data;

transmitting the sequences from the encoder to a partial response channel subject to noise; and transmitting the sequences from the channel to a Viterbi detector having a detector trellis structure derived from a running-digital-sum (RDS) trellis structure that is made time-varying by partitioning a set of quasi-catastrophic sequences generated by a canonical spectral null trellis into disjoint subsets, each of which subsets is assigned to a unique initial RDS state.

2. The method of claim 1, including the steps of:

generating codewords of the spectrally-constrained code from an initial RDS value; and constraining said codewords to assume, at an end and at least one prespecified interior location in each codeword, permissible RDS values prescribed by the initial RDS value.

3. The method of claim 1, including the steps of:

deleting predetermined edges from the time-varying trellis structure at preselected times corresponding to at least one prespecified location within each codeword to provide a modified trellis structure, each said edge terminating in a state corresponding to one of a preselected subset of permissible RDS values;

vertically compressing states and edges remaining in the modified trellis structure;

providing an auxiliary trellis structure representing sequences deleted from the time-varying trellis structure;

recursively computing survivor sequences and survivor metrics in the auxiliary trellis structure and modified trellis structure; and transferring the survivor sequences and survivor metrics from the auxiliary trellis structure to the modified trellis structure at said preselected times for states corresponding to said permissible RDS values.

4. The method of claim 1, including the step of providing a systolic structure as the detector trellis structure.

5. The method of claim 4, including the step of assigning to add-compare-select (ACS) units detector states rotated cyclically by an amount determined by codeword length and number of permissible RDS trellis states.

6. The method of claim 5, wherein said amount is an integer equal to the quotient obtained by dividing the number of RDS trellis states by a number that is divisible into the codeword length.

7. The method of claim 5, wherein the codeword length is 10, the number of permissible RDS trellis states is 6, and the detector states are rotated cyclically by 3.

8. In a method for improving reliability of a data storage device that transmits binary data as codewords over a partial response channel, the steps of:

encoding from the binary data a spectral-null trellis code that constrains codewords generated from an initial running digital sym (RDS) value to assume, at the end and also at at least one prespecified location within the codewords, subsets of permissible RDS values prescribed by the initial RDS value; and transmitting spectral null sequences from the channel to a Viterbi detector having a detector trellis structure derived from RDS trellis structured by (i) replicating preselected sets of RDS states and edges over a predetermined time period less than a full trellis period to form subtrellises from one portion of a main trellis, and (ii) connecting, at the end of said time period, an identical subset of states of each subtrellis with identical states of a remaining portion of the main trellis.

9. The method of claim 8, including the steps of:

deleting predetermined edges from the time-varying trellis structure at preselected times corresponding to at least one prespecified location within each codeword to provide a modified trellis structure, each said edge terminating in a state corresponding to one of a preselected subset of permissible RDS values; and vertically compressing states and edges remaining in the modified trellis structure.

10. The method of claim 9, including the steps of:

providing an auxiliary trellis structure representing sequences deleted from the time-varying trellis structure;

recursively computing survivor sequences and survivor metrics in the auxiliary trellis structure and modified trellis structure; and transferring the survivor sequences and survivor metrics from the auxiliary trellis structure to the modified trellis structure at said preselected times for states corresponding to said permissible RDS values.

11. A method for detecting spectral null sequences of a spectrally-constrained code, comprising the steps of:

using an encoder, generating the spectral null sequences from digital electrical signals representing unencoded input data;

transmitting the sequences from the encoder to a partial response channel subject to noise; and transmitting the sequences from the channel to a Viterbi detector having a detector trellis structure derived from a running-digital-sum (RDS) trellis structure by (i) replicating preselected sets of RDS states and edges over a predetermined time period less than a full trellis period to form subtrellises from one portion of a main trellis, and (ii) connecting, at the end of said time period, an identical subset of states of each subtrellis with identical states of a remaining portion of the main trellis.

12. The method of claim 11, including the steps of:

deleting predetermined edges from the time-varying trellis structure and vertically compressing said structure to create a modified trellis structure; and transferring survivor sequences and survivor metrics from an auxiliary trellis structure to the modified trellis structure as a substitute for those corresponding to the deleted edges at preselected times corresponding to at least one prespecified location within each codeword, each said edge terminating in a state corresponding to one of a preselected subset of permissible RDS values.

13. An apparatus for transmitting sequences of codewords of a spectrally-constrained code over a partial response channel, comprising:

an encoder for generating the codewords from digital electrical signals representing unencoded input data and transmitting said codewords to the channel; and a Viterbi detector that receives output words generated by the channel from the transmitted codewords and has a time-varying detector trellis structure derived from a running-digital-sum (RDS) trellis structure in which a set of quasicatastrophic sequences generated by a canonical spectral null trellis is partitioned into disjoint subsets, each of which subsets is assigned to a unique initial RDS state that renders said sequences non-catastrophic.

14. The apparatus of claim 13, wherein said encoder constrains said codewords to assume, at an end and at least one prespecified interior location in each codeword, permissible RDS values prescribed by an initial RDS value.

15. The apparatus of claim 13, wherein:
   (i) an auxiliary trellis structure represents sequences deleted from the time-varying trellis structure and the auxiliary trellis structure comprises two complementary substructures, and
   (ii) the detector comprises a branch metric unit that recursively computes survivor metrics for the two complementary substructures.

16. The apparatus of claim 13, wherein the Viterbi detector has a systolic trellis structure.

17. The apparatus of claim 13, wherein the Viterbi detector includes:
   (i) a plurality of add-compare-select (ACS) units with fixed-branch metric inputs; and
   (ii) means for selectively assigning, in a preselected cyclical manner, different detector states to each of said ACS units during successive stages to reduce the number of interconnections between respective ACS units.

18. The apparatus of claim 13, wherein the detector comprises:
   a local survivor memory unit (LSMU) having a number of shift registers equal to the maximum number of RDS values in the time-varying trellis structure, each shift register having the length of one codeword; and
   a global survivor memory unit (GSMU) connected to the LSMU and comprising a plurality of shift registers, each having a length of one codeword and containing a respective estimated survivor codeword, the shift registers of the GSMU being arranged in sets of x shift registers, where x is equal to the number of beginning and ending states of the time-varying trellis structure.

19. The apparatus of claim 13, wherein the encoder divides the input data into subsequences of input data words having a preselected length ratio to subsequences of codewords in a configuration of concatenated subsets of sequences with prespecified RDS values to constrain said codewords to assume, at an end and at least one prespecified interior location in each codeword, permissible RDS values prescribed by an initial RDS value and simplify mapping between sets of input data words and codewords.

20. The apparatus of claim 19, wherein each input data word and each codeword comprises two subsequences of equal length.

21. The apparatus of claim 19, wherein the encoder divides each set of input data words into subsets with preselected Hamming weights of equal length subsequences.

* * * * *